US006477592B1

(12) United States Patent
Chen et al.

(10) Patent No.: US 6,477,592 B1
(45) Date of Patent: Nov. 5, 2002

(54) SYSTEM FOR I/O INTERFACING FOR SEMICONDUCTOR CHIP UTILIZING ADDITION OF REFERENCE ELEMENT TO EACH DATA ELEMENT IN FIRST DATA STREAM AND INTERPRET TO RECOVER DATA ELEMENTS OF SECOND DATA STREAM

(75) Inventors: Jawji Chen, Fremont; Shuen-Chin Chang, San Jose; Yong E. Park, Los Altos; Cindy Yuklin Ng; Chiayao S. Tung, both of Cupertino, all of CA (US); Jeongsik Yang, Kyungpook (KR)

(73) Assignee: Integrated Memory Logic, Inc., Campbell, CA (US)

( * ) Notice: Subject to any disclaimer, the term of this patent is extended or adjusted under 35 U.S.C. 154(b) by 0 days.

(21) Appl. No.: 09/369,636

(22) Filed: Aug. 6, 1999

(51) Int. Cl.[7] .......................... G06F 13/20; G06F 13/28

(52) U.S. Cl. .......................... 710/52; 710/33; 710/35; 710/55

(58) Field of Search .............................. 710/33, 52, 35, 710/55

(56) References Cited

U.S. PATENT DOCUMENTS

| 3,601,702 A | 8/1971 | Lender |
| 3,649,751 A | 3/1972 | So |
| 3,723,875 A | 3/1973 | Kawashima et al. |

(List continued on next page.)

OTHER PUBLICATIONS

"Direct Rambus Technology: The New Main Memory Standard," Richard Crisp, IEEE Micro, Nov./Dec. 1997, pp. 18–28.

Draft Standard for A High–Speed Memory Interface (Synclink), IEEE Standards Department, (unapproved draft), Oct. 14, 1996, pp. 1–56.

"400 Mb/s/pin SLDRAM, 4M x 18 SLDRAM Pipelined, Eight Bank, 2.5V Operation," Draft/Advance, SLDRAM Consortium, Jul. 9, 1998, pp. 1–69.

"Main Memory Roadmap," May 10, 1998 SLDRAM; http://www.sldram.com/Documents/Roadmap/sld001.htm.

"SLDRAM Architectural and Functional Overview," Peter Gillingham, MOSAID Technologies, Inc., SLDRAM Consortium, Aug. 29, 1997, pp. 1–14.

*Primary Examiner*—Jeffrey Gaffin
*Assistant Examiner*—Rehana Perveen
(74) *Attorney, Agent, or Firm*—Skjerven Morrill LLP; Philip W. Woo

(57) ABSTRACT

An I/O interface circuit includes an output buffer circuit and an input buffer circuit. The output buffer circuit can receive a first stream of data elements for output from the semiconductor chip, add a separate reference element for each data element in the first stream, and generate a first data transmission signal representing the data elements of the first stream and the respective reference elements. The input buffer circuit can receive a second data transmission signal representing data elements of a second stream and respective reference elements for the data elements of the second stream, sample the second data transmission signal to obtain voltage values for each data element of the second stream and the respective reference element, and interpret the voltage value for each data element of the second stream against the voltage value for the respective reference element in order to recover the data elements of the second stream.

26 Claims, 16 Drawing Sheets

U.S. PATENT DOCUMENTS

| | | | |
|---|---|---|---|
| 3,723,880 A | | 3/1973 | Van Gerwen |
| 3,761,818 A | | 9/1973 | Tazaki et al. |
| 3,838,214 A | | 9/1974 | Lind |
| 3,943,284 A | | 3/1976 | Nelson |
| 4,010,421 A | | 3/1977 | Lind |
| 4,123,710 A | | 10/1978 | Stuart et al. |
| 4,837,821 A | | 6/1989 | Kage |
| 4,862,276 A | * | 8/1989 | Wang et al. ............ 358/213.31 |
| 5,166,956 A | | 11/1992 | Baltus et al. |
| 5,450,023 A | | 9/1995 | Yang et al. |
| 5,499,269 A | | 3/1996 | Yoshino |
| 5,512,750 A | * | 4/1996 | Yanka et al. ............ 250/338.4 |
| 5,684,833 A | | 11/1997 | Watanabe |
| 5,793,815 A | | 8/1998 | Goodnow et al. |
| 5,793,816 A | | 8/1998 | Hui |
| 5,898,886 A | | 4/1999 | Hewitt |
| 5,915,105 A | | 6/1999 | Farmwald et al. |
| 5,953,263 A | | 9/1999 | Farmwald et al. |
| 5,954,804 A | | 9/1999 | Farmwald et al. |
| 5,995,443 A | | 11/1999 | Farmwald et al. |
| 6,005,895 A | | 12/1999 | Perino et al. |
| 6,052,134 A | | 4/2000 | Foster |
| 6,252,536 B1 | * | 6/2001 | Johnson et al. ............ 341/155 |

* cited by examiner

Fig. 13 CDS I/O Buffer
Double Data Rate Timing (even #)

Fig. 15 Three-Level CDS Output Buffer

SYSTEM FOR I/O INTERFACING FOR SEMICONDUCTOR CHIP UTILIZING ADDITION OF REFERENCE ELEMENT TO EACH DATA ELEMENT IN FIRST DATA STREAM AND INTERPRET TO RECOVER DATA ELEMENTS OF SECOND DATA STREAM

CROSS-REFERENCE TO RELATED PATENT APPLICATION

This application relates to the subject matter disclosed in U.S. patent application Ser. No. 09/135,986 filed on Aug. 17, 1998 now U.S. Pat. No. 6,324,602, entitled "Advanced Input/Output Interface For Integrated Circuit Device," which is assigned to the present assignee and incorporated in its entirety herein by reference.

TECHNICAL FIELD OF THE INVENTION

The present invention relates generally to the field of semiconductor integrated circuits, and more particularly, to input/output interfacing for a semiconductor chip.

BACKGROUND OF THE INVENTION

Data input into or output from an integrated circuit (IC) device is represented by a sequence of varying voltage values appearing in an appropriate signal. For data that is output from an IC device, the voltage level for a logical "0" (logic-0) is generally referred to as "voltage output low" or "$V_{OL}$," while the voltage level for a logical "1" (logic-1) is generally referred to as "voltage output high" or "$V_{OH}$." For data that is input into an IC device, the voltage level for a logic-0 is generally referred to as "voltage input low" or "$V_{IL}$," while the voltage level for a logic-1 is generally referred to as "voltage input high" or "$V_{IH}$."

For the signals which communicate data to and from an IC device, a reference voltage ($V_{REF}$) may define how the sequence of voltage values in each signal should be interpreted or construed in order to derive the represented data. Furthermore, suitable margins above and below the reference voltage are provided for interpretation of the signals.

Various industry-standard, interface signaling technologies have been developed for transmitting data to and from an IC device. These signaling technologies include transistor-to-transistor logic (TTL), low-voltage TTL (LVTTL), stub-series terminated logic (SSTL_3 or SSTL_2), and RAMBUS signaling level (RSL).

The logic-0 ($V_{IL}$ and $V_{OL}$) and logic-1 ($V_{IH}$ and $V_{OH}$) voltage levels are different for each interface signaling technology. TTL and LVTTL have relatively large signal swings and do not require a reference voltage to determine whether the data under transfer is either a logic-0 or a logic-1. SSTL_2, SSTL_3 and RSL have smaller signal swings (0.8–1.2 volts) for high speed data transfer, and require a reference voltage for interpreting data. RSL utilizes an open-drain output driver with external pull-up termination resistor connected to a termination voltage $V_{TT}$. The following chart provides values for the voltage levels of the various interface signaling technologies.

|  | VIH | VIL | VOH | VOL | VREF | VTT | VDDQ |
|---|---|---|---|---|---|---|---|
| TTL | 2.4 V | 0.8 V | 2.4 V | 0.8 V | N/A | N/A | 5 V |
| LVTTL | 2.0 V | 0.8 V | 2.0 V | 0.8 V | N/A | N/A | 3.3 V |
| SSTL-3 | VREF + 0.4 V | VREF − 0.4 V | VTT + 0.6/0.8 V | VTT − 0.6/0.8 V | 1.5 ± 0.2 V | 1.5 ± 0.05 V | 3.3 V |
| SSTL-2 | VREF + 0.35 V | VREF − 0.35 V | VTT + 0.57/ 0.76 V | VTT − 0.57/0.76 V | 1.25 ± 0.1 V | VREF ± 0.04 V | 2.5 V |
| RSL | 1.8 V | 1.0 V | 1.8 V | 1.0 V | 1.4 V | 1.8 V | 2.5 V |

Note:
(1) All numbers listed in the chart above are typical values.
(2) VDDQ is the power supply for data output driver.

The use of a reference voltage ($V_{REF}$) to determine the logic level of data with some interface signaling technologies (i.e., those having a small signal swing) presents many disadvantages. For example, a number of different factors—such as varying internal supply voltage or reference voltage, or noise created at one or more voltage drivers—can cause the value of the signal levels (e.g., $V_{OH}$, $V_{OL}$, $V_{IH}$, $V_{IL}$) to drift or change. This results in a loss of signal margin during operation, which ultimately can lead to problems with data integrity. Furthermore, with previously developed interface technologies, the signal levels of logic-1 and logic-0 are not scaleable. This sets constraints on the bandwidth of data transfer. Also, because signal levels are not scalable, the interface technologies are plagued with high power consumption and significant switching noise. This in turn causes problems in designing systems in which semiconductor integrated circuits with different electrical I/O interface specifications are used, due to the scaling down of design rules and lithography of the integrated circuits. In addition, previously developed interface technologies utilize a high data slew rate that causes electromagnetic interference (EMI) problem, especially when a wider data bus is desirable to meet the bandwidth requirements of a high performance system. Accordingly, it is difficult to achieve appropriate data setup and hold times for high data rate operation.

SUMMARY OF THE INVENTION

The disadvantages and problems associated with previously developed interfaces for an integrated circuit device have been substantially reduced or eliminated using the present invention.

According to the present invention, a correlated double-sampling (CDS) technique is provided for the input and output of data in a semiconductor chip. For each element (e.g., bit) of data in an outgoing data stream, the technique adds a separate reference element. The data elements and respective reference elements are represented by corresponding voltage values in a transmission signal output by the semiconductor chip. When the transmission signal is received by another semiconductor chip, it is sampled for both the data elements and the respective reference elements—hence, the term "double-sampling". Each reference element is used to interpret the corresponding data element so that the data element can be recovered. For example, in one embodiment, the data element may be compared against the respective reference element.

An input/output (I/O) interface circuit, according to one embodiment of the present invention, implements the CDS technique. For output from a semiconductor chip, the CDS I/O interface circuit adds a reference element for each data element in an outgoing data stream. The CDS I/O interface circuit generates a transmission signal in which the data elements and respective reference elements are represented by corresponding voltage values. The transmission signal is sent out from the semiconductor chip. For input into the semiconductor chip, the CDS I/O interface circuit receives a transmission signal wherein various voltage values represent a number of data elements and respective reference elements. The CDS I/O interface circuit samples the received signal for the data elements and reference elements. The CDS I/O interface circuit interprets each data element using the respective reference element.

In accordance with one embodiment of the present invention, an I/O interface circuit for a semiconductor chip is provided. The I/O interface circuit includes an output buffer circuit and an input buffer circuit. The output buffer circuit can receive a first stream of data elements for output from the semiconductor chip, add a separate reference element for each data element in the first stream, and generate a first data transmission signal representing the data elements of the first stream and the respective reference elements. The input buffer circuit can receive a second data transmission signal representing data elements of a second stream and respective reference elements for the data elements of the second stream, sample the second data transmission signal to obtain voltage values for each data element of the second stream and the respective reference element, and interpret the voltage value for each data element of the second stream against the voltage value for the respective reference element in order to recover the data elements of the second stream.

In accordance with another embodiment of the present invention, a method for interfacing between a first semiconductor chip and a second semiconductor chip includes the following steps: receiving a stream of data elements for output from the first semiconductor chip; adding a separate reference element for each data element in the stream; generating a data transmission signal representing the data elements of the stream and the respective reference elements; transmitting the data transmission signal out of the first semiconductor chip; receiving the data transmission signal at the second semiconductor chip; sampling the data transmission signal to obtain voltage values for each data element of the data stream and the respective reference element; and interpreting the voltage value for each data element of the second stream against the voltage value for the respective reference element in order to recover the data elements of the data stream at the second semiconductor chip.

In accordance with yet another embodiment of the present invention, an integrated circuit device includes a number of semiconductor chips. A central access hub, coupled to each of the semiconductor chips, receives a stream of data elements for output from the integrated circuit device. The central access hub adds a separate reference element for each data element in the stream and generates a data transmission signal representing the data elements and the respective reference elements.

An important technical advantage of the present invention includes providing a separate reference element for each data element in an outgoing data stream. The data and reference elements are represented by corresponding voltage values in a transmission signal output from a semiconductor chip. At another semiconductor chip which receives such signal, the signal is sampled for the data elements and reference elements. Each reference element can be used to interpret the respective data element. Because the data elements are interpreted against respective reference elements from the same media (such as a printed circuit board (PCB) trace, copper wire, etc.) rather than some absolute value for a reference voltage from a different media, the integrity of data is maintained. Furthermore, this aspect of the present invention allows the signal levels of logic-1 and logic-0 to be scaled. This can reduce the amount of power consumed and the noise margins for transmission signals.

Another technical advantage of the present invention includes providing a universal synchronous clock in an architecture comprising a plurality of integrated circuit devices or chips. The universal clock can be used for timing throughout all the devices.

Yet another technical advantage of the present invention includes controlling the slew rate for a signal output from a semiconductor chip. Slew rate control reduces the amount of electromagnetic interference (EMI) generated in transmission and signal reflection on a printed circuit board (PCB) trace.

Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE PREFERRED EMBODIMENTS

The preferred embodiments of the present invention and their advantages are best understood by referring to FIGS. 1 through 16 of the drawings. In these drawings, like numerals are used for like and corresponding parts.

Architecture

Figure 1:
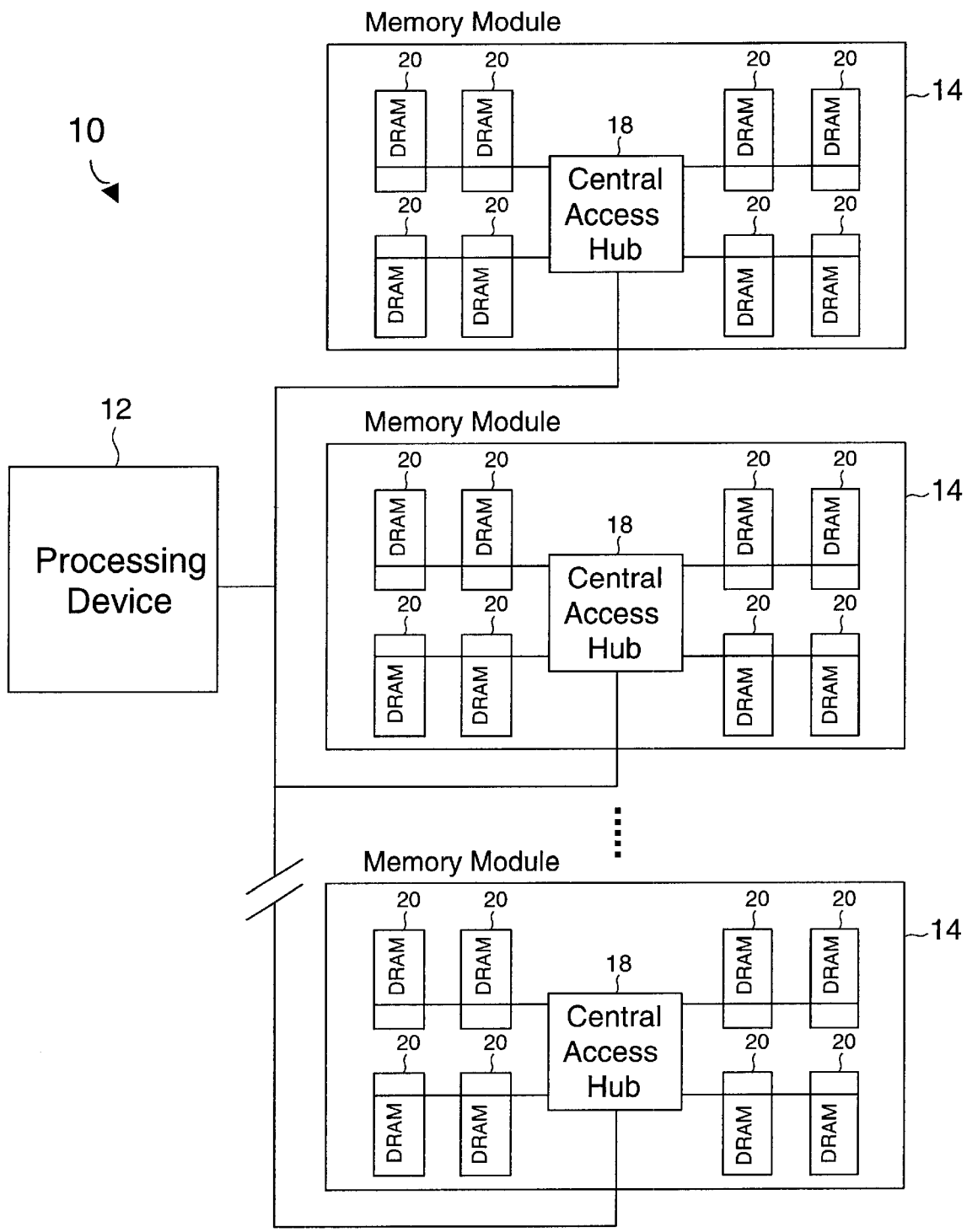
FIG. 1 illustrates an exemplary architecture in which a correlated double-sampling (CDS) technique, according to an embodiment of the present invention, can be used.

FIG. 1 illustrates an exemplary architecture 10 in which a correlated double-sampling (CDS) technique, according to an embodiment of the present invention, can be used. Architecture 10 includes a processing device 12 and a plurality of memory modules 14. Processing device 12 and memory modules 14 are integrated circuit (IC) devices which may be connected—for example, on a printed circuit board (PCB)—by a connection 16. As used herein, the terms "connected," "coupled," or any variant thereof, mean any connection or coupling, either direct or indirect, between two or more elements; the connection or coupling can be logical or physical. In one embodiment, connection 16 may comprise an MX-ARC DDR connection (supporting a CDS I/O interface, as explained herein). In an alternative embodiment, connection 16 may comprise an industrial standard bus connection, such as a PC-100, PC-133, PC-200, or PC-266 DDR connection.

Processing device 12 and memory modules 14 are separately packaged in suitable packaging (e.g., plastic, ceramic, micro-ball grid array (MBGA), or chip scale package (CSP)) with suitable leads or other connecting points extending therefrom (not shown). Each of processing device 12 and memory modules 14 may comprise one or more semiconductor chips, wherein a "chip" is a separate piece of semiconductor material having an integrated circuit. As depicted, processing device 12 has a single chip, whereas each memory module 14 has multiple chips. The chips in each memory module, 14 include one or more central access hubs 18 and one or more memory chips 20. In an alternate embodiment, processing device 12 may include multiple chips as well, such as, for example, a memory control chip and one or more processing chips.

Processing device 12 generally functions to process data and other information, which may be transferred to and from memory modules 14 for control, addressing, and other operations. Processing device 12 may comprise a microcontroller, a microprocessor, a central processing unit (CPU), a co-processor, a peripheral controller, a graphic controller (two-dimensional or three-dimensional), a mass storage controller, or other semiconductor chip for processing data and information. Processing device 12 may also direct the transfer of data/information between itself and memory modules 14.

Each memory module 14 generally functions to store the data and other information. For this purpose, each memory chip 20 can be any suitable IC memory including dynamic random access memory (DRAM), static random access memory (SEAM), non-volatile random access memory (NVRAM), and read only memory (ROM), such as erasable programmable ROM (EPROM), electrically erasable programmable ROM (EEPROM), and flash memory. As shown, each memory chip 20 comprises a DRAM.

The central access hub 18 in each memory module 14 coordinates the storage/retrieval of data to and from each of the respective memory chips 20. Each central access hub 18 and group of memory chips 20 may be connected by any suitable connection, such as, for example, an MX-ARC 133/166/200/266/332/400/500 MHz DDR connection supporting the CDS I/O interface technology (explained herein). Each central access hub 18 reconfigures the memory bus within the respective memory module 14 so that such bus acts as a local bus. This facilitates communication within the respective memory module 14, thereby allowing the memory module 14 to operate faster. Furthermore, because other semiconductor devices (e.g., processing device 12) only interact directly with central access hub 18, communication between memory module 14 and other devices is also made faster.

Numerous information signals (generated within or received by any of the chips in processing device 12 or memory module 14) convey, or control or coordinate the conveyance of, data to and from the various chips. These information signals include data signals for conveying data, addressing signals for identifying specific memory cells (described below) into and from which data is to be written or read, and control signals for coordinating or controlling the access, reading, and/or writing of the data. In each information signal, elements (e.g., bits) of information or data are represented by corresponding voltage values.

According to various embodiments of the present invention, a correlated double-sampling (CDS) technique can be used to input data into, and output data from, each of the chips of processing device 12 and memory modules 14. In general, this CDS technique provides a separate reference element for each element of data/information transferred between two or more chips (e.g., processing device 12, central access hubs 18, or memory devices 20) in architecture 10. Various schemes can be used for implementing the CDS technique. These schemes include a two-level scheme and a three-level scheme.

With the two-level scheme for implementing the CDS technique, only two signal levels are available for representing any reference element or data element in a transmission signal. These signal levels are a high voltage level (Voh) and a low voltage level (Vol). Each reference element has a logic value (as represented by a corresponding signal level) which is the opposite that of the respective data element (as also represented by a corresponding signal level). Thus, for a data element having a logic value of "0" (represented by signal level Vol), the respective reference element is given a logic value of "1" (represented by signal level Voh). Similarly, for a data element having a logic value of "1" (represented by signal level Voh), the respective reference element is given a logic value of "0" (represented by signal level Vol). In symbolic terms, for a given data element D, the respective reference element is $\overline{D}$.

With the three-level scheme, two signal levels are available for representing any data element and a third signal level is provided for representing each reference element. The signal levels for a data element are a high voltage level ($V_{OH}$) and a low voltage level ($V_{OL}$). The signal level for the reference element is a reference voltage level ($V_{REF}$) output by a reference voltage source. Each reference element is represented by a voltage value which coincides with the voltage level of the reference voltage source at the time that the reference element is created. Thus, as data elements are transferred between chips in a transmission signal, any drift in the voltage level of the source is reflected by voltage values representing the reference elements in the transmission signal.

With both the two-level scheme and the three-level scheme, each data element is interpreted using the respective reference element. In particular, for each data element in an incoming data transmission signal, a first sample is taken to obtain a voltage value for the reference element and a second sample is taken to obtain a voltage value for the respective data element—hence, the term "double sampling." The voltage value for the data element is considered against the voltage value for the reference element in construing the logic value of the data element. Because the data elements are interpreted in light of respective reference elements rather than some absolute reference level, interpretation of the data elements is more accurate, and thus optimized. The CDS technique is further described herein.

Processing Device and Memory Module

Figure 2:
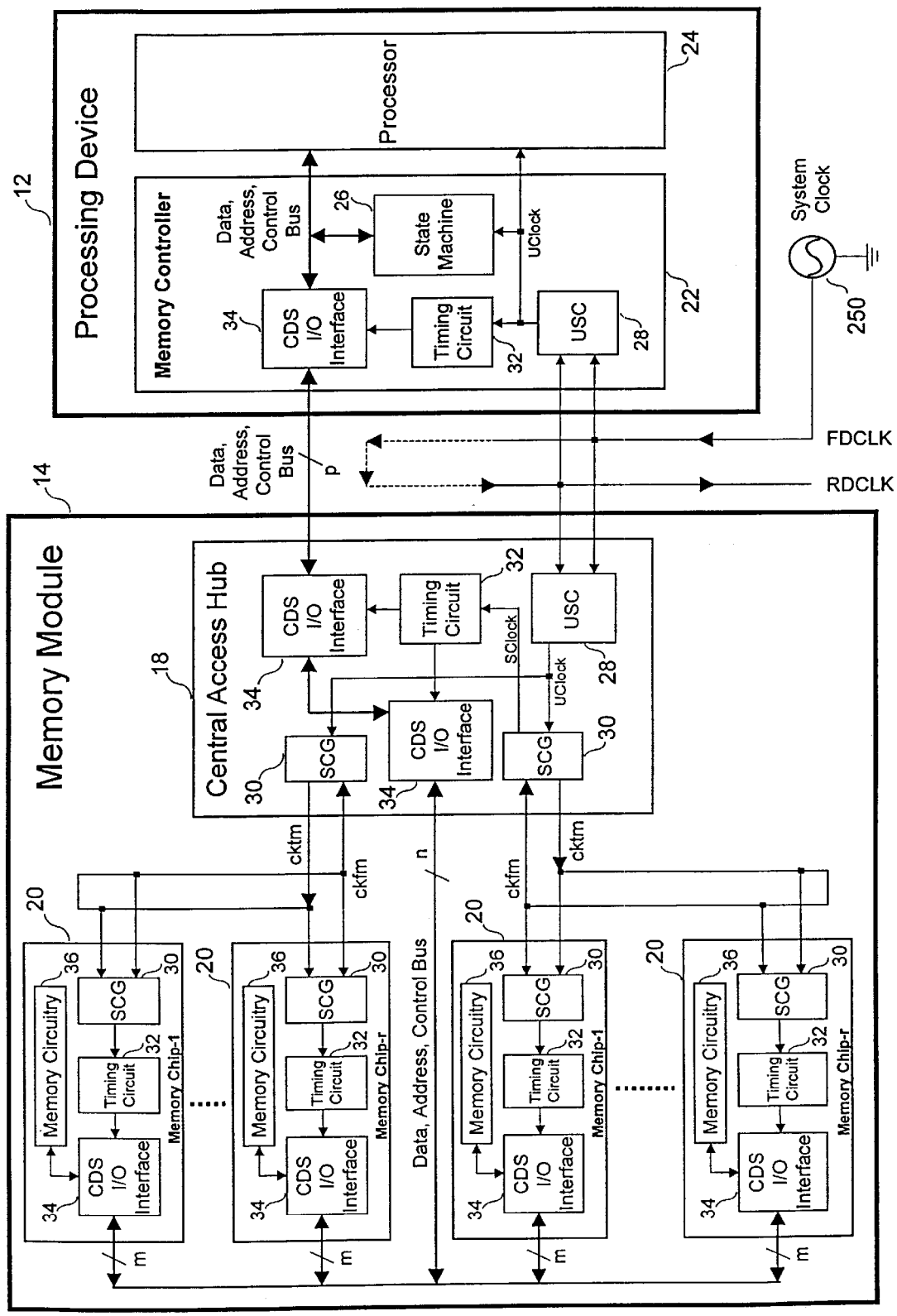
FIG. 2 illustrates details for a processing device and a memory module in the exemplary architecture of FIG. 1.

FIG. 2 illustrates details for processing device 12 and a memory module 14 in exemplary architecture 10 (FIG. 1). Processing device 12 and memory module 14 are integrated circuit (IC) devices which may be connected, for example, on a printed circuit board (PCB) having a number of traces.

Processing device 12 transfers data and other information to and from memory module 14 for control, addressing, processing, and other operations. As depicted, processing device 12 includes a memory controller 22 coupled to a processor 24. Although memory controller 22 and processor 24 are integral to the same chip in this embodiment, it is contemplated that memory controller 22 and processor 24 can be situated on separate chips in an alternative embodiment. Processor 24 functions to process data and other information, which may be transferred to and from memory module 14 for control, addressing, and other operations. Memory controller 22 directs the transfer of data/information between processor 24 and memory module 14.

Memory controller 22 includes a state machine circuit 26, a universal synchronous clock (USC) circuit 28, a timing circuit 32, and a CDS I/O interface circuit 34. State machine circuit 26 generates all necessary DRAM (interface) control timings and addresses to perform one or more predetermined logical operations on data. These operations place state machine circuit 26 in various states which control the input/output of data to and from processing device 12.

USC circuit 28 is connected to a forward direction clock (FDCLK) signal and a reverse direction clock (RDCLK) signal, which are output by a system clock source 250. Using the FDCLK and RDCLK signals, USC circuit 28 generates a universal synchronous clock (UClock) signal, which is a clock signal that is synchronized throughout all chips in an architecture, such as architecture 10 of FIG. 1. In order to generate the UClock signal, USC circuit 28 extracts the phase difference between FDCLK and RDCLK signals. A synchronous clock (SClock) signal may be derived from the universal synchronous clock (UClock) signal.

Timing circuit 32, coupled to USC circuit 28, outputs one or more timing signals, such as, for example, a decoding clock (CLK2) signal. The decoding clock (CLK2) signal may have a frequency equal to twice that of the universal synchronous clock (UClock) and synchronous clock (SClock). Each timing signal is derived from the universal synchronous clock (UClock) signal and can be used to time the operation of other elements in the chip. For example, the timing signals may maintain synchronization between, for example, the universal clock signal and a data transmission signal (either incoming or outgoing).

CDS I/O interface circuit 34 is coupled to timing circuit 32. CDS I/O interface circuit 34 functions, among other things, to format data being sent out of processing device 12, drive outgoing signals, "double sample" incoming signals, and reformat or recover data from the sampled incoming signals.

USC circuit 28, timing circuit 32, and CDS I/O interface circuit 34 of processing device 12 cooperate to provide an interface for the input and output of data to and from processing device 12. According to an embodiment of the present invention, USC circuit 28, timing circuit 32, and CDS I/O interface circuit 34 implement a CDS I/O interface technique. In this technique, as data is transferred out of processing device 12 in an outgoing data stream, USC circuit 28, timing circuit 32, and CDS I/O interface circuit 34 cooperate to add a separate reference element for each element of data in the stream. The circuits 28, 32, and 34 generate an outgoing transmission signal wherein the data elements and reference elements are represented by corresponding voltage values. When a similarly formatted data transmission signal is received at processing device 12, USC circuit 28, timing circuit 32, and CDS I/O interface circuit 34 cooperate to double sample the signal for the data elements and reference elements. These circuits 28, 32, and 34 interpret each data element using a respective reference element.

Central access hub 18 in memory module 14 is coupled to, and cooperates with, memory controller 22 of processing device 12 to transfer data between the IC devices. As depicted, central access hub 18 comprises a USC circuit 28, a timing circuit 32, and a number of CDS I/O interface circuits 34. These circuits are substantially similar to the like-named circuits of memory controller 22. USC circuit 28 receives the forward direction clock (FDCLK) and reverse direction clock (RDCLK) signals, and uses these clock signals to derive the universal synchronous clock (UClock). USC circuit 28 provides a way to synchronize all on-chip operations among the different chips on the same computer system.

Central access hub 18 also includes one or more synchronous clock generator (SCG) circuits 30. As depicted, two SCG circuits 30 are provided. In general, each SCG circuit 30 functions to generate or maintain a synchronous clock signal (SClock), which is synchronous to, and has the same frequency as, the universal synchronous clock signal (UClock). The SClock signal is input into timing circuit 32 of central access hub 18 to generate all of the required clocks to operate the central access hub. In one embodiment, a separate SCG circuit 30 is provided for each grouping (as explained below) of memory chips 20 in memory module 14. Thus, for a memory module 14 with k groupings, central access hub 18 includes k number of SCG circuits 30.

Each SCG circuit 30 of the central access hub 18 also functions to generate/output respective clock-to-memory (cktm) and clock-from-memory (ckfm) signals. zeal The SCG circuit sends the cktm signal to each memory chip 20 in a respective grouping and routes the same signal back to itself as the ckfm signal. With this operation, the phase difference between the cktm and ckfm signals can be determined by using the delay created by a printed circuit board (PCB) trace. This is done to provide the synchronous clock (SClock) signal at each memory chip 20, as further explained below.

USC circuit 28, and one of the SCG circuits 30, timing circuit 32, and one of the CDS I/O interface circuits 34 of central access hub 18 support communication with chips external to memory module 14, such as, for example, processing device 12. In particular, these circuits implement the CDS I/O interface technique for data sent out to, and received from, processing device 12. USC circuit 28, the other SCG circuit 30, timing circuit 32, the other CDS I/O interface circuit 34 support communication with chips internal to memory module 14, such as, for example, memory chips 20. These circuits implement the CDS I/O interface technique for data sent out to, and received from, memory chips 20.

Memory chips 20 are coupled to central access hub 18. Each memory chip 20 can be implemented as any suitable type of IC memory including, for example, dynamic random access memory (DRAM), static random access memory (SRAM), non-volatile random access memory (NVRAM), and read only memory (ROM), such as erasable programmable ROM (EPROM), electrically erasable programmable ROM (EEPROM), and flash memory. Memory chips 20 can be divided into a number (k) of groupings, with a predetermined number of chips 20 in each grouping.

Each memory chip 20 includes memory circuitry 36, an SCG circuit 30, a timing circuit 32, and a CDS I/O interface circuit 34. Memory circuitry 36 comprises circuitry for storing and retrieving data. This circuitry may include memory arrays, cells, addressing circuitry, timing circuitry, and the like, as further described below.

SCG circuit 30 generates the synchronous clock (SClock) signal for the memory chip 20. To accomplish this, SCG circuit 30 receives the clock-to-memory (cktm) signal and clock-from-memory (ckfm) signal output by an SCG circuit 30 in central access hub 18. The SCG circuit 30 of the memory chip 20 extracts the phase difference between the cktm and ckfm signals to provide an SClock signal on memory chip 20 that is synchronous with the SClock signal of central access hub 18.

Timing circuit 32 and CDS I/O interface circuit 34 of each memory chip 20 are substantially similar to the like-named circuits of memory controller 22 and central access hub 18. The respective SCG circuits 30, timing circuits 32, and CDS I/O interface circuits 34 implement the CDS I/O interface technique for signals sent out to, and received from, central access hub 18.

In exemplary operation, CDS I/O interface circuits 34 may transfer information (e.g., data, address, and control information) in the form of one or more transmission signals between any of processing device 12, central access hub 18, and memory chips 20. The transmission signals are generated at one of CDS I/O interface circuits 34 and received at another of the CDS I/O interface circuits 34.

Each transmission signal, which includes voltage values representing data elements and reference elements, can be a multi-phase signal. In one phase referred to as the "data phase," the voltage value of the signal corresponds to data element. In another phase referred to as the "reference phase," the voltage value of the signal corresponds to reference element, which can be used to interpret the respective data element. Preferably, the reference phase for a reference element immediately precedes or follows the data phase for a respective data element. Each combination of a reference phase and corresponding data phase constitutes a single data cycle.

Two formats can be used for data transfer: (1) a single data rate (SDR) format, and (2) a double data rate (DDR) format. For the SDR format, every data cycle is equal to two decoding clock (CLK2) cycles. Therefore, both the reference phase and data phase have a period equal to one decoding clock (CLK2) cycle time. For the DDR format, every data cycle is equal to one decoding clock cycle. Thus, both the reference phase and data phase have a period equal to one-half of the decoding clock (CLK2) cycle time.

Memory Chip

Figure 3:
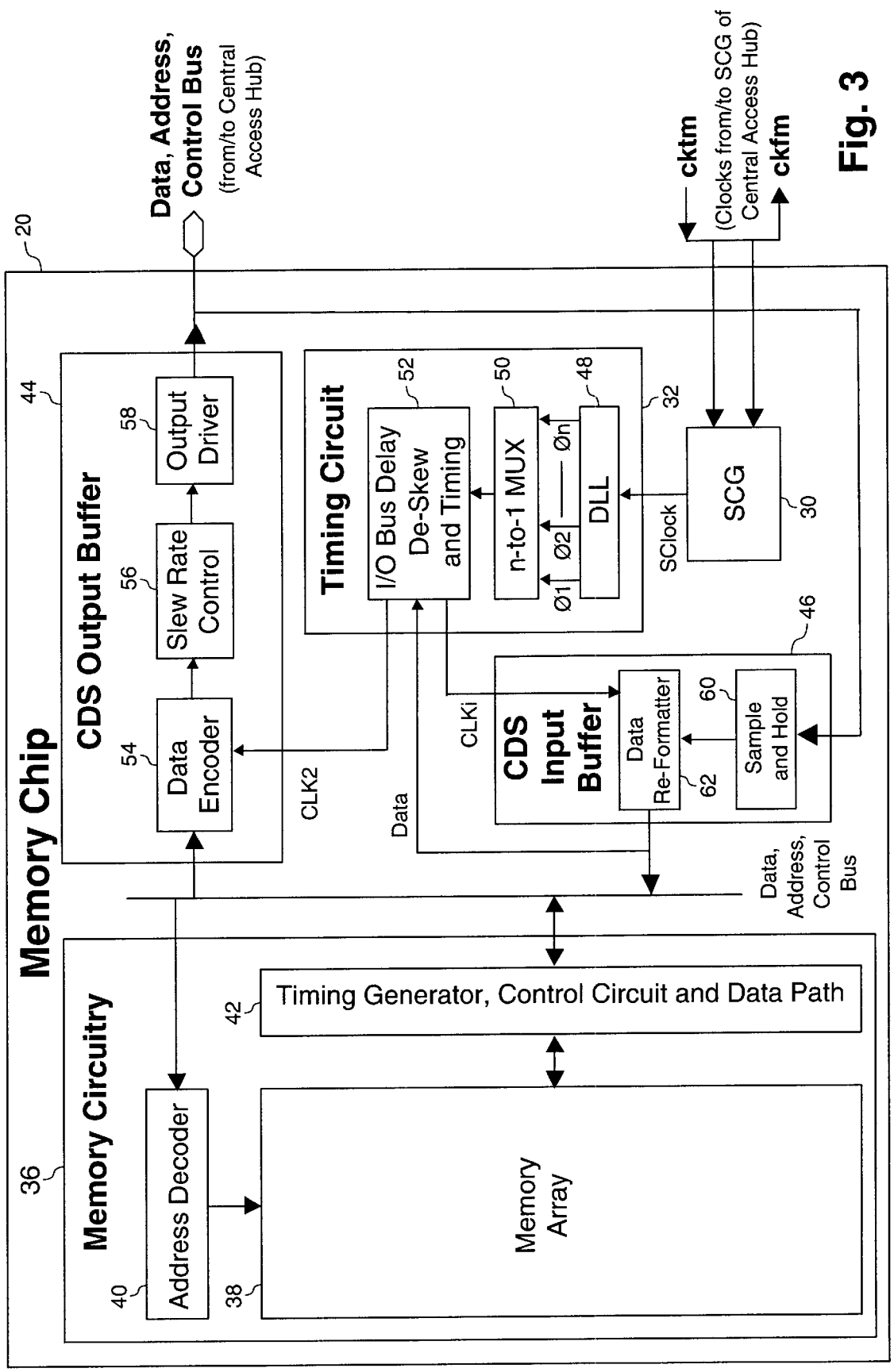
FIG. 3 is a block diagram of a memory chip having circuitry for implementing CDS technique, in accordance with an embodiment of the present invention.

FIG. 3 is a block diagram of a memory chip 20 having circuitry for implementing the correlated double-sampling (CDS) technique, in accordance with an embodiment of the present invention. As depicted, memory chip 20 includes SCG circuit 30, timing circuit 32, CDS I/O interface circuit 34 (comprising CDS output buffer circuit 44 and CDS input buffer circuit 46), and memory circuitry 36.

Memory circuitry 36 comprises a memory array 38. Memory array 38 includes a plurality of memory cells (not shown), each of which functions to maintain data. In particular, separate elements of data may be written into, stored, and read out of each of these memory cells. The memory cells may be fabricated in any suitable technology, such as metal-oxide semiconductor (MOS) technology, according to techniques well-known and understood by those skilled in the art of IC memory.

Further, these memory cells of memory array 38 can be organized in any suitable structure, such as, for example, a matrix of rows and columns. A typical architecture connects all cells in a row to a common row line, often referred to as a "word line," and all cells in a column to a common column line, often referred to as a "bit line." Any suitable addressing scheme, such as row-column (i.e., X-Y coordinate) addressing or content-addressing, can be used to access the memory cells within memory array 38.

Memory circuitry 36 also comprises address decoder circuitry 40 and other circuitry 42 which support the storage, maintenance, and/or access of information in the memory cells of memory array 38. For example, address decoder circuitry 40 may include a number of row address buffers, column address buffers, row decoders, column decoders, and the like for accessing the various memory cells. Furthermore, circuitry 42 may include various timing generators, such as an output enable (OE) clock generator and a write enable (WE) clock generator, for enabling the reading and writing of data out of and into the memory cells. Circuitry 42 may also include circuitry for controlling and providing a data path for the transfer of data.

SCG circuit 30 generates the synchronous clock (SClock) signal for memory chip 20. This SCG circuit 30 on memory chip 20 may be connected to similar SCG circuits 30 on other chips to synchronize with the universal clock (UClock) signal throughout an architecture. To accomplish this, SCG circuit 30 receives the clock-to-memory (cktm) and clock-from-memory (ckfm) signals and extracts the phase difference between them.

Timing circuit 32 receives the synchronous clock (SClock) signal from SCG circuit 30. As shown, timing circuit 32 includes a delayed lock loop (DLL) circuit 48, an n-to-1 multiplexer (MUX) circuit 50, and an input/output (I/O) bus delay de-skew and timing circuit 52. In response to the SClock signal, DLL circuit 48 generates multi-phase clock signals Ø1, Ø2, . . . and Øn. These clock signals Ø1, Ø2, . . . and Øn have the same frequency, but different phases.

I/O bus delay de-skew and timing circuit 52 uses the multi-phase clock signals Ø1, Ø2, . . . and Øn to generate a number of timing signals, including CLKi and CLK2 (decoding clock) signals which are synchronized to the synchronous (SClock) signal. CLKi signal may have the same frequency as the SClock signal, and CLK2 signal may run at two times of the SClock frequency. The CLKi signal can be used for decoding of received data signals. The CLK2 signal can be used for encoding of outgoing data signals—i.e., the CLK2 signal can be used to synchronously transfer data out of memory chip 20.

Different time delays (or timing skew) may arise between the transmission and reception of data due to differences in printed circuit board (PCB) trace length or impedance mismatch on connection paths over which the data is transmitted. To compensate for this timing skew, it is necessary to select the correct timing phase of the multi-phase clock signals Ø1, Ø2, . . . and Øn to generate an appropriate CLK2 signal. I/O bus delay de-skew and timing circuit 52 may include one or more registers (not shown) for storing information to "de-skew" the timing signals. This de-skew information is generated by CDS input buffer circuit 46 by reading incoming data from another chip. I/O bus delay de-skew and timing circuit 52 may perform a de-skewing operation by stepping the CLKi signal through the different clock phases of Ø1, Ø2, . . . and Øn, until the expected data (logic-0 or logic-1) is received by the CDS input buffer circuit 46. Information for the clock phase that receives the correct expected data at CDS input buffer circuit 46 constitutes the de-skew information, which can be used to generate CLK2 for the corresponding CDS output buffer circuit 44 on the same chip. The I/O bus delay de-skew and timing circuit 52 thus ensures that data is transferred and received in a fully synchronous manner across the I/O data bus for all of data signals.

Multiplexer circuit 50, coupled to I/O bus delay de-skew and timing circuit 52, selects one of the multi-phase clock signals Ø1, Ø2, . . . and Øn generated by the DLL circuit 48 for each CDS input buffer circuit 46 and CDS output buffer circuit 44. For example, the CLKi signal is selected out of one of the clock phases Ø1, Ø2 . . . and Øn to synchronize the data sample and hold operation (explained below) of all CDS input buffer circuits 46. This operation is desirable for high speed data transfer because it reduces or eliminates timing skew as data transmission signals travel from the CDS output buffer circuits 44 of one chip to the CDS input buffer circuits 46 of another chip.

CDS I/O interface circuit 34 receives the decoding clock (CLK2) signal and other timing signals (such as CLKi signal) from timing circuit 32. In general, CDS I/O interface circuit 34 includes various circuitry for: (a) buffering data, generating information signals therefrom, and outputting the signals; and (b) receiving information signals, recovering data in each received signal, and buffering the data for use in the respective semiconductor chip. As depicted, CDS I/O interface circuit 34 is separated into CDS output buffer circuit 44 and CDS input buffer circuit 46.

In general, CDS output buffer circuit 44 functions to buffer and format data to generate signals for output, for example, from memory chip 20. In one embodiment, CDS output buffer circuit 44 includes a data encoder circuit 54, a slew rate control circuit 56, and an output driver circuit 58. Data encoder circuit 54, which receives the decoding clock (CLK2) signal from timing circuit 32, functions to encode each stream of data to be sent out of memory chip 20. Specifically, data encoder circuit 54 adds a reference element for each element of data in an outgoing data stream. Slew rate control circuit 56 controls the slew rate at which output driver circuit 58 transitions an outgoing transmission signal (conveying the data) from a low value to a high value, or from a high value to a low value. Output driver circuit 58 drives the outgoing transmission signal at the slew rate (or transition time) determined by slew rate control circuit 56.

CDS input buffer circuit 46 receives the CLKi timing signal from timing circuit 32 and incoming data signals from, for example, other chips. CDS input buffer circuit 46 functions to sample the incoming signals and reformat the sampled values in order to retrieve data. For this, CDS input buffer circuit 46 may include a sample and hold circuit 60 and a data re-formatter circuit 62.

Central Access Hub

Figure 4:
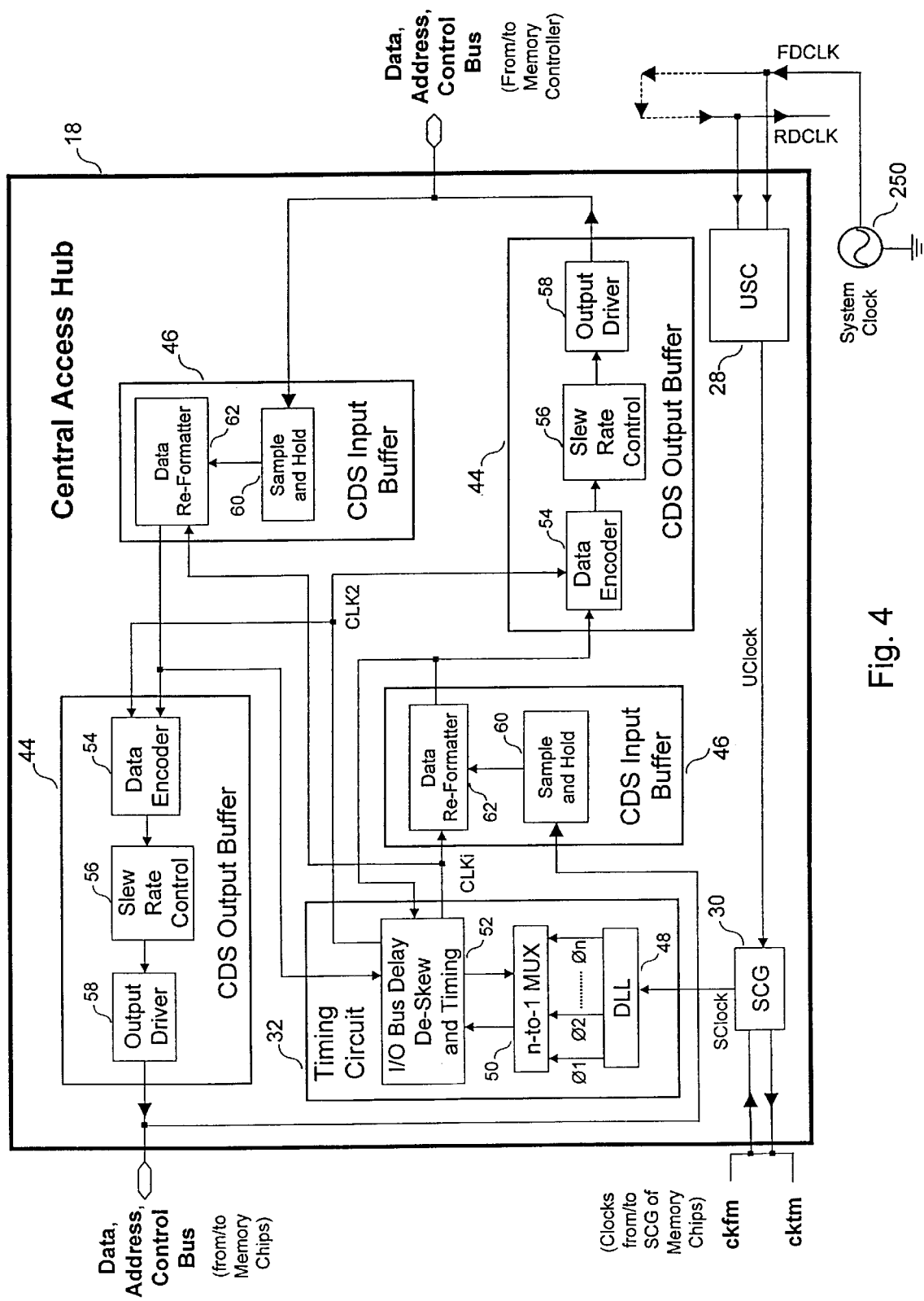
FIG. 4 is a block diagram of a central access hub having circuitry for implementing the CDS technique, in accordance with an embodiment of the present invention.

FIG. 4 is a block diagram of central access hub 18 having circuitry for implementing the correlated double-sampling (CDS) technique, in accordance with an embodiment of the present invention. Central access hub 18 may be incorporated into a memory module 14 (FIG. 1) and generally functions to transfer data into and out of such memory module. As depicted, central access hub 18 comprises a USC circuit 28, an SCG circuit 30, a timing circuit 32, and two CDS I/O interface circuits 34 (each comprising a CDS output buffer circuit 44 and a CDS input buffer circuit 46).

USC circuit 28 is provided for cooperating with a similar circuit in memory controller 22 of processing device 12. USC circuit 28 cooperates with other USC circuits 28 to maintain the universal synchronous clock (UClock) signal so that such signal is synchronized throughout central access hub 18, as well as architecture 10 (FIG. 1) in general. SCG circuit 30, coupled to USC circuit 28, is provided for generating the synchronous clock (SClock) signal for central access hub 18. In one embodiment, a separate SCG circuit 30 is provided for each grouping of memory chips 20 in a memory module 14.

Timing circuit 32 receives the synchronous clock (SClock) signal output by the SCG circuit 30. As shown, timing circuit 32 includes a delayed lock loop (DLL) circuit 48, an n-to-1 multiplexer (MUX) circuit 50, and an I/O bus delay de-skew and timing circuit 52. These circuits 48, 50, and 52 of central access hub 18 are connected and operate in a substantially similar to the like-named circuits of memory chip 20 described above with reference to FIG. 3. Thus, DLL circuit 48 may output multi-phase clock signals Ø1, Ø2, . . . and Øn; multiplexer circuit 50 multiplexes the timing signals; and I/O bus delay de-skew and timing circuit 52 generates a number of clock signals, including CLK2 and CLKi, for timing in central access hub 18.

One CDS I/O interface circuit 34 is provided for data transmission signals output to and received from memory controller 22 of processing device 12, while the other CDS I/O interface circuit 34 is provided for data transmission signals output to and received from memory chips 20. Each CDS I/O interface circuit 34 is separated into a CDS output buffer circuit 44 and a CDS input buffer circuit 46. Each CDS output buffer circuit 44 includes a data encoder circuit 54, a slew rate control circuit 56, and an output driver circuit 58. Each CDS input buffer circuit 46 includes a sample and hold circuit 60 and a data re-formatter circuit 62. The buffer circuits 44 and 46—and their component circuits 54, 56, 58, 60, and 62—are substantially similar to the like-named circuits of a memory chip 20 described above with reference to FIG. 3.

Processing Device

Figure 5:
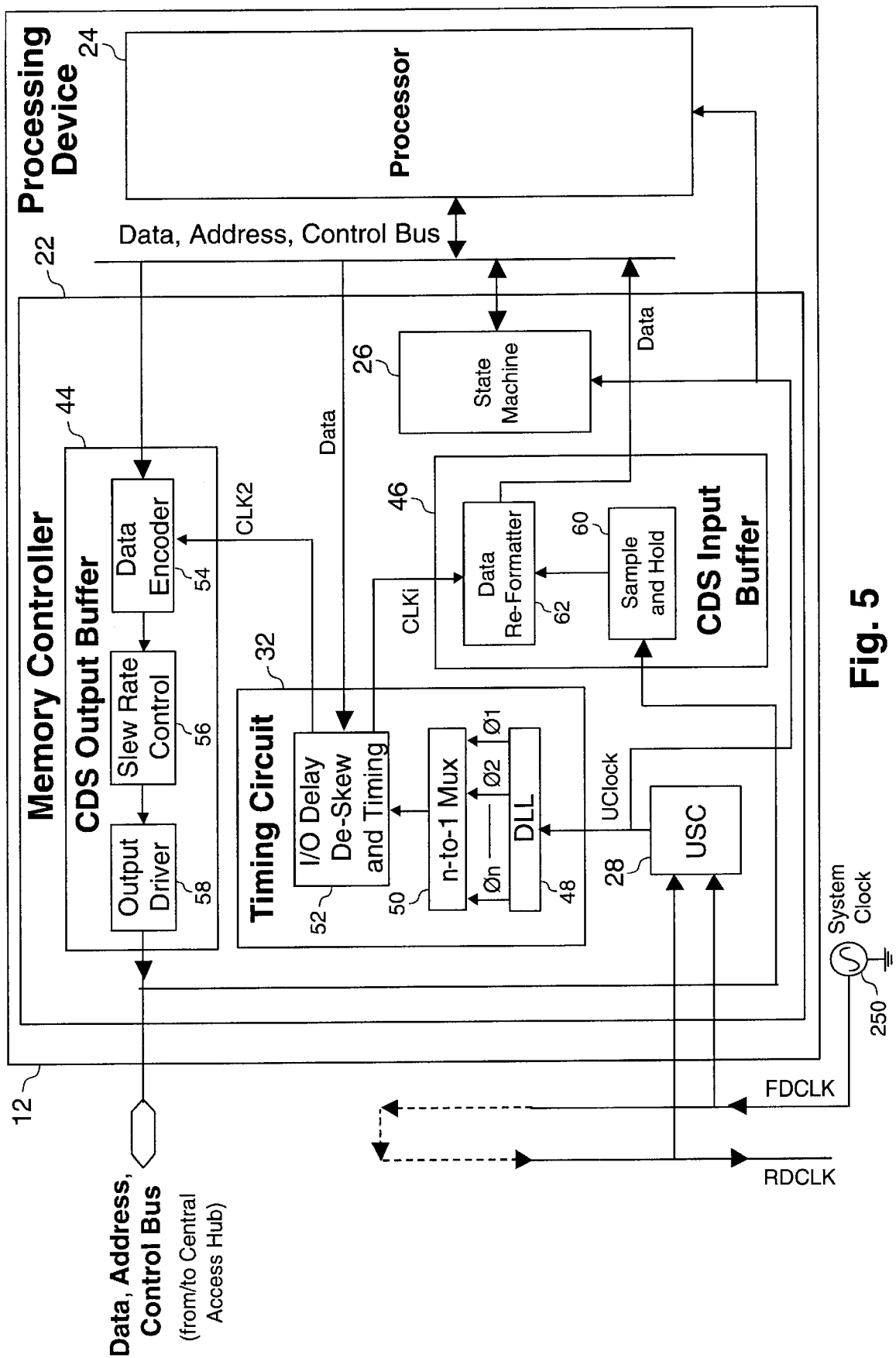
FIG. 5 is a block diagram of a processing device having circuitry for implementing the CDS technique, in accordance with an embodiment of the present invention.

FIG. 5 is a block diagram of a processing device 12 having circuitry for implementing the correlated double-sampling (CDS) technique, in accordance with an embodiment of the present invention. Processing device 12 comprises memory controller 22 and processor 24.

Memory controller 22 includes USC circuit 28, timing circuit 32, and CDS I/O interface circuit 34 (comprising a CDS output buffer circuit 44 and a CDS input buffer circuit 46).

USC circuit 28 in memory controller 22 maintains the universal clock (UClock) signal so that such signal is synchronized throughout processing device 12, as well as architecture 10 (FIG. 1) in general.

Timing circuit 32 receives the universal clock (UClock) signal output by USC circuit 28. Timing circuit 32 includes a DLL circuit 48, an n-to-1 multiplexer (MUX) circuit 50, and an I/O bus delay de-skew and timing circuit 52. These circuits 48, 50, and 52 are substantially similar to the like-named circuits of a memory chip 20 and central access hub 18 described above with reference to FIGS. 3 and 4, respectively.

CDS I/O interface circuit 34 is provided for data transmission signals output to and received from, for example, one or more memory modules 14. CDS I/O interface circuit 34 is separated into CDS output buffer circuit 44 and CDS input buffer circuit 46. CDS output buffer circuit 44 includes a data encoder circuit 54, a slew rate control circuit 56, and an output driver circuit 58. CDS input buffer circuit 46 includes a sample and hold circuit 60 and a data re-formatter circuit 62. The buffer circuits 44 and 46—and their component circuits 54, 56, 58, 60, and 62—are substantially similar to the like-named circuits of a memory chip 20 and central access hub 18 described above with reference to FIGS. 3 and 4.

CDS I/O Interface

Figure 6:
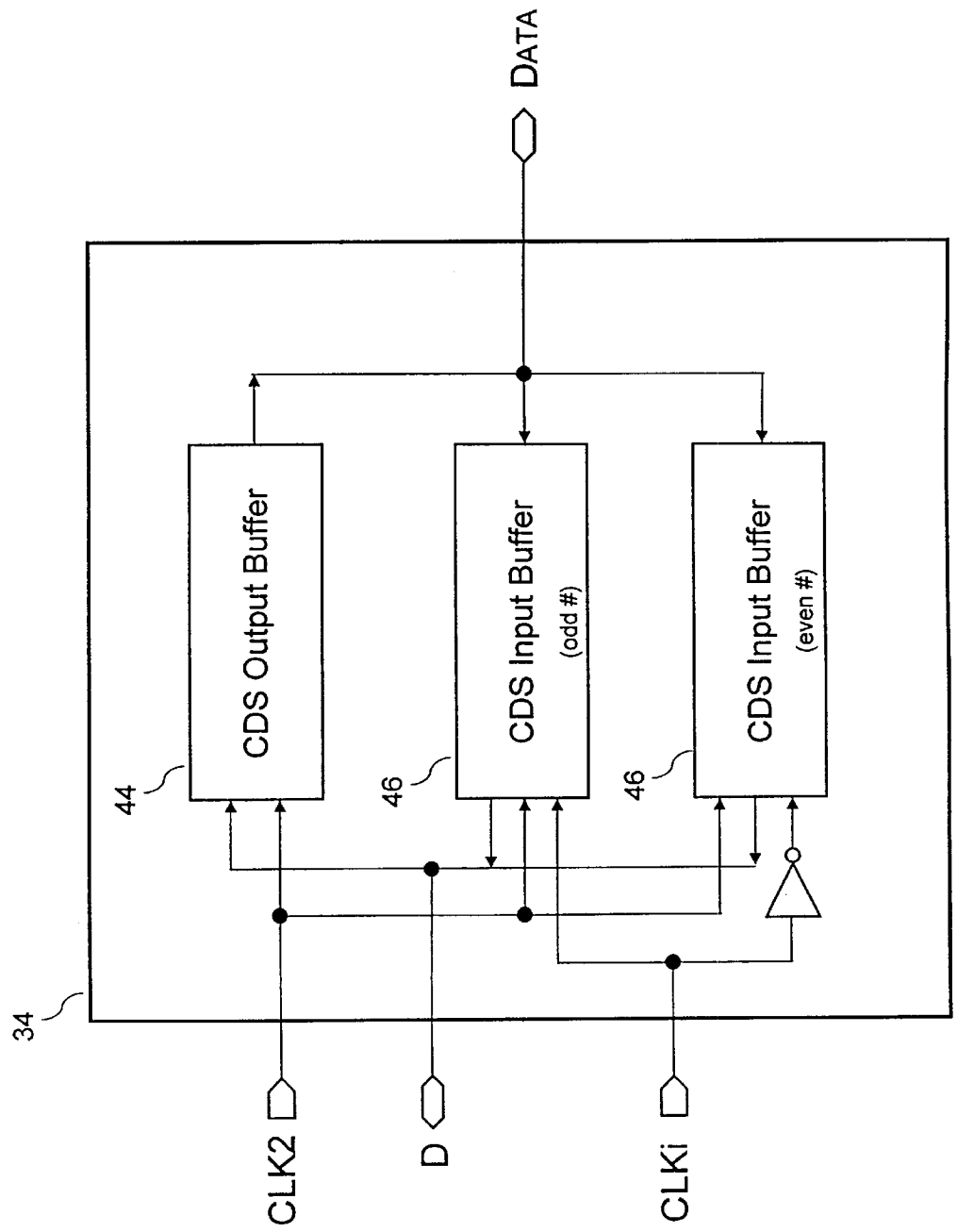
FIG. 6 is a block diagram of a CDS input/output (I/O) interface circuit, in accordance with an embodiment of the present invention.

FIG. 6 is a block diagram of one configuration for a CDS I/O interface circuit 34, in accordance with an embodiment of the present invention. CDS I/O interface circuit 34 may be incorporated into a semiconductor chip. In this configuration, CDS I/O interface 34 includes a single CDS output buffer circuit 44 and two CDS input buffer circuits 46.

CDS I/O interface circuit 34 converts between a stream of data D and a DATA transmission signal. Data D may comprise a sequence of data elements, each of which can have value of logic-1 or logic-0. The DATA signal is a transmission signal in which the data elements are represented by corresponding voltage values. The DATA signal can be either transmitted from or received by the semiconductor chip into which CDS I/O interface 34 is incorporated.

For a DATA signal transmitted out of the semiconductor chip, CDS output buffer 44 formats or encodes data D to generate an outgoing signal, controls the slew rate of the signal, and drives the signal. With the encoded format, data D can be transmitted across a data bus (connecting a plurality of integrated circuit devices) at very high data rate and more reliably than with previously developed technologies. CDS output buffer 44 receives, and can be timed with, the decoding clock (CLK2) signal. The CLK2 signal is synchronized with the synchronous (SClock) signal and may have a frequency which is twice that of the SClock signal.

For a DATA signal received by the integrated circuit device, CDS input buffer circuits 46 samples the incoming DATA signal and recovers the real data D using the sampled values. In one embodiment, CDS input buffer circuits 46 double sample the incoming DATA signal and recover the data D for use by other circuit elements of the integrated circuit device. The format of data D can be either double data rate (DDR) or single data rate (SDR) format. Each CDS input buffer 46 can be timed with the CLKi signal. As shown, one CDS input buffer 46 receives the CLKi signal, while the other CDS input buffer 46 receives an inverted CLKi signal. The CLKi signal is synchronized with, and may have the same frequency as, the synchronous (SClock) signal.

One of the CDS input buffer circuits 46 may operate on one part of an incoming DATA transmission signal, while the other may operate on another part of the incoming DATA signal. For example, the data D (represented by corresponding voltage values within the DATA signal) may be divided equally based upon positioning in a stream or sequence. Data D at odd-numbered positions in the sequence (i.e., first, third, fifth, etc. positions) are recovered by the first CDS input buffer circuit 46. Data D at even-numbered positions in the sequence (i.e., second, fourth, sixth, etc. positions) are recovered by the second CDS input buffer circuit 46.

CDS output buffer circuit 44 and CDS input buffer circuits 46 may operate either according to the two-level scheme or the three-level scheme for implementing the CDS technique. Embodiments of a CDS output buffer circuit 44 which can be used for the two-level scheme are illustrated and described with reference to FIGS. 7, 10, and 11 below. Embodiments of a CDS output buffer circuit 44 which can be used for the three-level scheme are illustrated and described with reference to FIGS. 15 and 16 below. Embodiments of a CDS input buffer circuit 46 which can be used for both the two-level and the three-level schemes are illustrated and described with reference to FIGS. 8, 9, and 12–14 below.

CDS Output Buffer Circuit (Two-Level)

Figure 7:
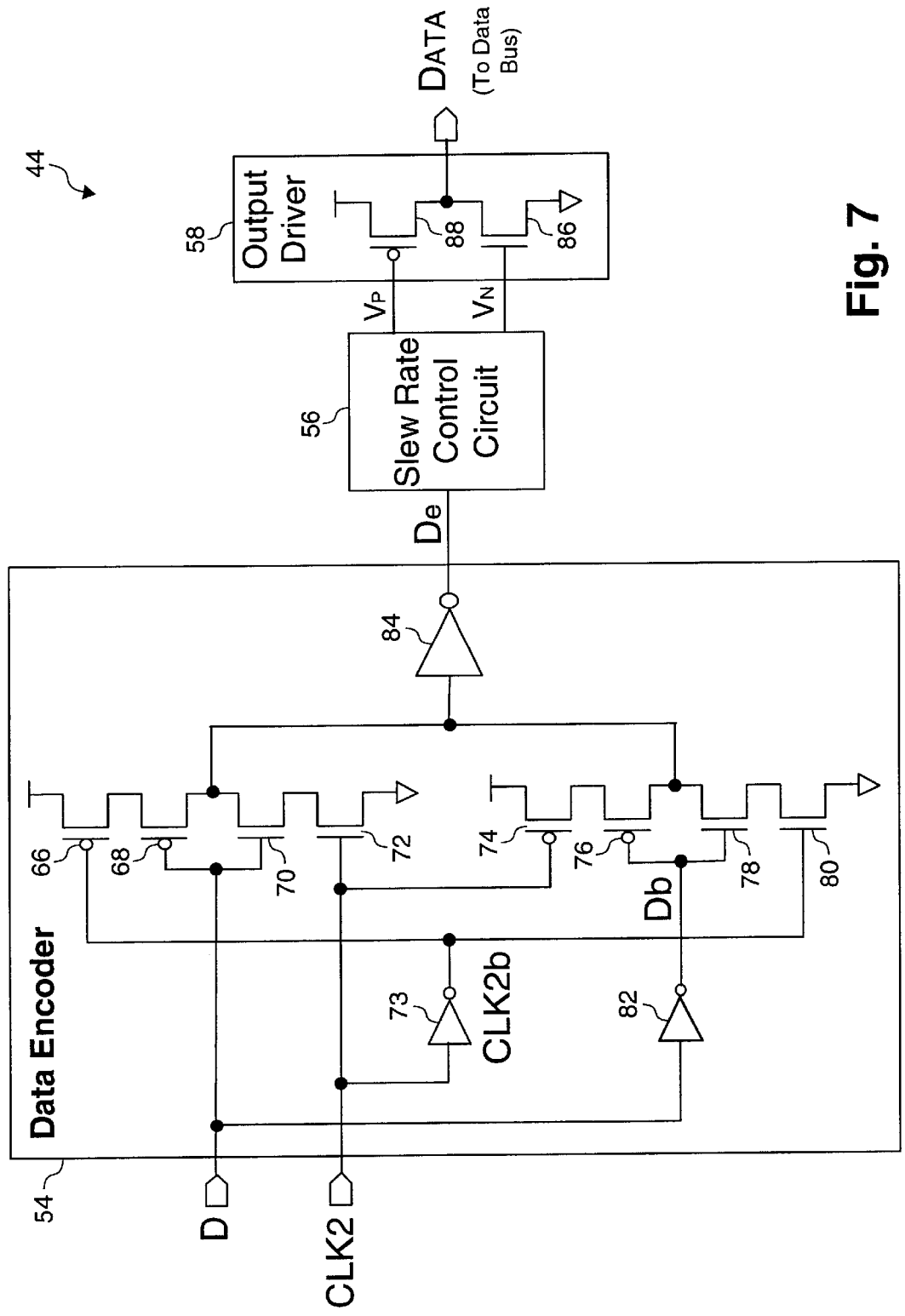
FIG. 7 is a schematic diagram, in partial block form, of a CDS output buffer circuit for a two-level scheme, in accordance with an embodiment of the present invention.

FIG. 7 is a schematic diagram, in partial block form, of a correlated double-sampling (CDS) output buffer circuit 44 for a two-level scheme, in accordance with an embodiment of the present invention. CDS output buffer circuit 44, which may be a part of a CDS I/O interface circuit 34, can be incorporated into a semiconductor chip, such as, for example, any of processing device 12, central access hub 18, or memory chips 20 (FIG. 1).

CDS output buffer circuit 44 operates on a stream of data D to be output from the semiconductor device. The data stream may include a number of data elements (e.g., bits), each of which can be a binary element having a logical value of either "0" (logic-0) or "1" (logic-1). A data element with a logical value of "0" may be referred to as a "data-0," and a data element with a logical value of "1" may be referred to as a "data-1".

CDS output buffer circuit 44 includes a data encoder circuit 54, a slew rate control circuit 56, and an output driver circuit 58. These circuits 54, 56, and 58 cooperate to generate a DATA transmission signal for transferring data D out of the semiconductor chip. With the two-level scheme for implementing the CDS technique, only two signal levels are available for the DATA signal. These signal levels are a high voltage level (Voh) and a low voltage level (Vol).

As depicted, data encoder circuit 54 comprises a plurality of transistors 66, 68, 70, and 72 connected in series between a voltage source and ground. The gate of transistor 72 receives the decoding clock (CLK2) signal, and the gate of transistor 66 receives an inverted decoding clock (CLK2b) signal output from an inverter gate 73. Transistors 68 and 70 receive the data D at their gates and cooperate to invert the data D. Another plurality of transistors 74, 76, 78, and 80 are also connected in series between the voltage source and ground. The gate of transistor 74 receives the decoding clock (CLK2) signal, and the gate of transistor 80 receives the inverted decoding clock (CLK2b) signal. Transistors 76 and 78 receive inverted data D (output by an inverter gate 82), and cooperate to invert the inverted data D. An inverter gate 84 alternately inverts the output of the first plurality of transistors 66–72 and the second plurality of transistors 74–80.

Data encoder circuit 54 encodes data D according to the two-level scheme. More specifically, for each element of data D in a stream, data encoder circuit 54 adds a separate reference element which has a logic value (represented by a corresponding voltage level) which is the opposite to that of the respective data element. In symbolic terms, for a given data element D, the respective reference element is $\overline{D}$. The first plurality of transistors 66–72 generates the reference elements, and the second plurality of transistors 74–80 generates the data elements. Thus, for a data-0, transistors 74–80 will generate a data element with a value of logic-0, and transistors 66–72 will generate a reference element with a value of logic-1. The reference element of logic-1 is output in a reference phase followed by the data element of logic-0 output in a data phase. Alternatively, for a data-1, transistors 74–80 will generate a data element with a value of logic-1, and transistors 66–72 will generate a reference element with a value of logic-0. The reference element of logic-0 is output in a reference phase followed by the data element of logic-1 output in a data phase. The output of data encoder circuit 54 is encoded data De.

Each combination of a reference phase and corresponding data phase constitutes a single data cycle. In one embodiment, as indicated immediately above, a transition from logic-1 to logic-0 within a data cycle defines a data-0. A transition from logic-0 to logic-1 within a data cycle defines a data-1.

As previously described, two formats can be used for data transfer: (1) single data rate (SDR) format, and (2) double data rate (DDR) format. For the SDR format, every data cycle is equal to two decoding clock (CLK2) cycles. For the DDR format, every data cycle is equal to one decoding clock cycle. Therefore, for the SDR format, both the reference phase and data phase are equal to one cycle of the decoding clock; for the DDR format, both the reference phase and data phase are equal to one-half of a cycle of the decoding clock.

Slew rate control circuit 56, coupled to data encoder circuit 54, receives the encoded data De therefrom. Slew rate control circuit 56 functions to regulate or control the slew rate (or transition time) of the DATA signal for transmitting the encoded data De. This allows the signal to be transferred out of the semiconductor chip at maximum speed. Slew rate control circuit 56 generates a pair of control signals ($V_N$ and $V_P$) for output driver circuit 58. Control signal $V_N$ will go high when the encoded data De is data-0. Control signal $V_P$ will go low when the encoded data De is data-1.

Output driver circuit 58 receives the control $V_N$ and $V_P$ signals. In response to these control signals, output driver circuit 58 drives the outgoing DATA transmission signal at a predetermined slew rate controlled by slew rate control circuit 56. As shown, output driver circuit 58 can be implemented as a push-pull CMOS driver. More specifically, output driver circuit 58 comprises an NMOS pull-down transistor 86 and a PMOS pull-up transistor 88 coupled between the voltage source and ground. Control signal $V_N$ is applied at the gate of NMOS pull-down transistor 86 and control signal $V_P$ is applied at the gate of PMOS pull-up transistor 88.

When control signal $V_N$ goes high (because an element of incoming data D is data-0), the initial slew rate and voltage level of signal $V_N$ is controlled in a way such that the fall time of the DATA transmission signal is greater than that of the printed circuit board (PCB) trace delay time for the data bus. This minimizes the signal reflection due to impedance mismatch (if any) of the data bus.

When control signal $V_P$ goes low (because an element of incoming data D is data-1), the initial slew rate and voltage level of signal $V_P$ is controlled in a way such that the rise time of the DATA transmission signal is greater than that of the printed circuit board (PCB) trace delay time of the data bus. Again, this minimize the signal reflection on the data bus.

In one embodiment (not shown), an external pull-up resistor ($R_T$) may be provided for output driver circuit 58 on each data bus. The pull-up resistor is connected to a termination voltage source ($V_{TT}$), which determines the minimum Voh. The pull-up resistor serves as a termination resistor to match bus impedance, thus minimizing signal reflection on the bus. The voltage value of the termination voltage source can be in the range of 0.9–1.3V, which is suitable for multiple generations of integrated circuits with power supply values ranging from 3.3V down to 1.2V. The preferred range of voltage values for the termination voltage source is 1.1+/–0.2V.

With the two-level scheme of this embodiment for CDS output buffer circuit 44, only two signal levels (Voh and Vol) are available for the outgoing DATA transmission signal. A data element having a logic value of "0" may be represented by signal level Vol, and the respective reference element with a logic value of "1" is represented by signal level Voh. Similarly, a data element having a logic value of "1" can be represented by signal level Voh, and the respective reference element with a logic value of "0" is represented by signal level Vol.

An exemplary timing diagram for this embodiment of a CDS output buffer circuit 44 operating at double data rate (DDR) is illustrated and described with reference to FIG. 10. An exemplary timing diagram for this embodiment of a CDS output buffer circuit 44 operating at single data rate (SDR) is illustrated and described with reference to FIG. 11.

CDS Input Buffer Circuit

CDS input buffer circuit 46, which may be a part of a CDS I/O interface circuit 34, can be incorporated into a semiconductor chip, such as, for example, any of processing device 12, central access hub 18, or memory chips 20 (FIG. 1). CDS input buffer circuit 46 may comprise a sample and hold circuit 60 and a data re-formatter circuit 62.

Figure 8:
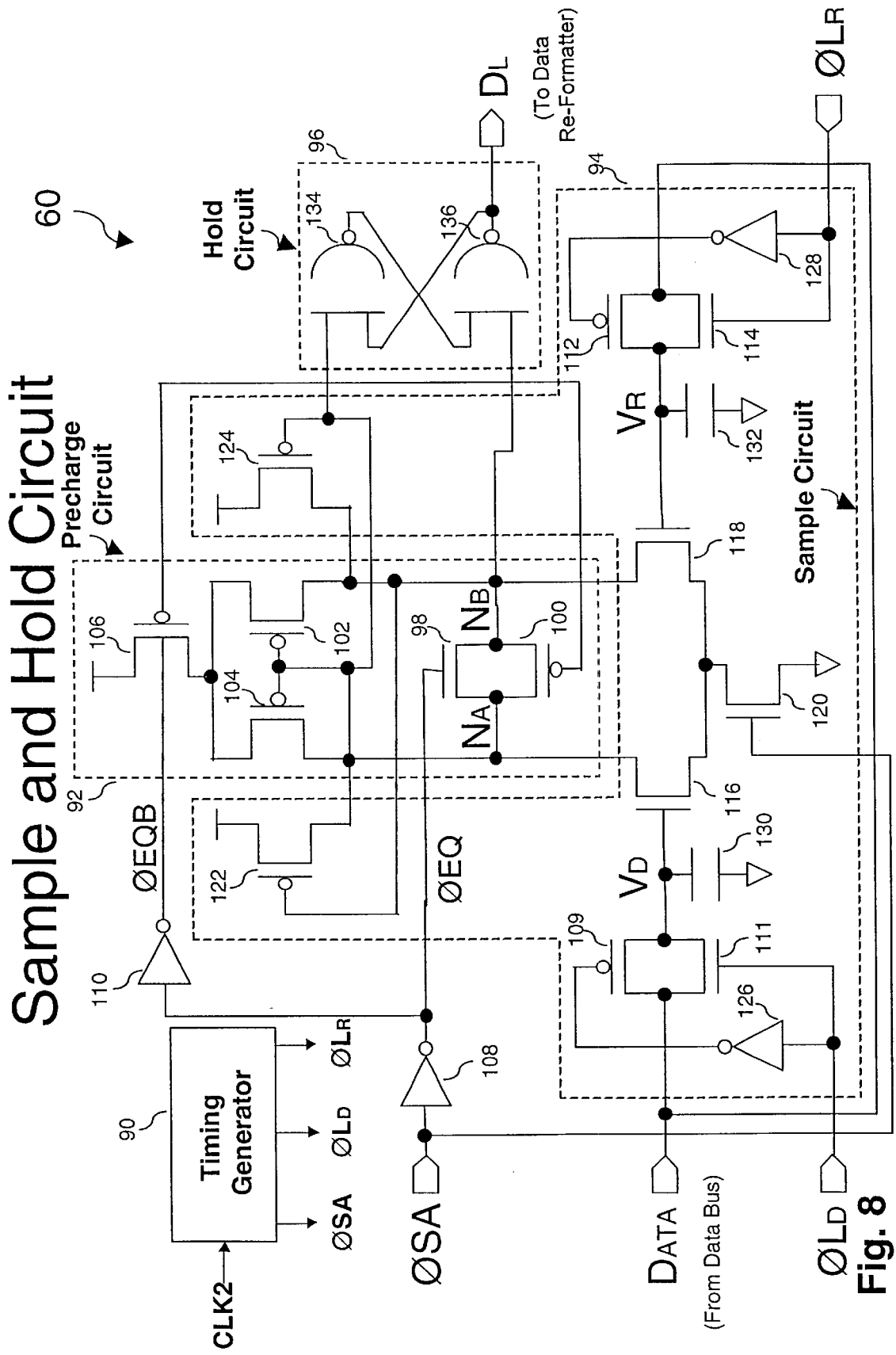
FIG. 8 is a schematic diagram of a sample and hold circuit for a two-level or three-level scheme, in accordance with an embodiment of the present invention.

Referring to FIG. 8, a schematic diagram of a sample and hold circuit 60, in accordance with an embodiment of the present invention, is shown. In general, sample and hold circuit 60 receives a DATA transmission signal formatted in either a two-level or three-level scheme, recovers data D from the received DATA signal, and buffers the data D for use in the respective semiconductor chip. As depicted, sample and hold comparator circuit 60 generally includes a timing generator circuit 90, a precharge circuit 92, a sample circuit 94, and a hold circuit 96.

Timing generator circuit 90 receives the decoding clock (CLK2) signal, and uses such signal to generate or derive a number of timing signals. These timing signals include a sense amplifier timing signal (ØSA), a latch data timing signal (ØL$_D$), and a latch reference timing signal (ØL$_R$). The timing signals ØSA, ØL$_D$, and ØL$_R$ are fully synchronized to the synchronous clock (SClock) signal of the chip, and can be used to sample and latch the incoming DATA signal.

Precharge circuit 92 generally functions to precharge a node $N_A$ and a node $N_B$ to a level of approximately $V_{CC}-V_{TP}$ (where $V_{TP}$ is the threshold voltage of a PMOS transistor). The voltage value of $V_{CC}-V_{TP}$ corresponds to a logic-1 state for NAND gates 134 and 136 (described below). Precharge circuit 92 receives equalization clock signals ØEQA and ØEQB, which are derived from the sense amplifier timing signal (ØSA) by an inverter gate 108 and an inverter gate 110. As shown, precharge circuit 92 includes transistors 98, 100, 102, 104, and 106. Transistors 98 and 100 are connected together between nodes $N_A$ and $N_B$. Equalization clock signal ØEQA is applied at the gate of transistor 98, and equalization clock signal ØEQB is applied at the gate of transistor 100. Transistor 102 is connected between node $N_B$ and VCC (through transistor 106). Similarly, transistor 104 is connected between node $N_A$ and VCC (through transistor 106). The gate of transistor 106 receives the equalization clock signal ØEQB.

In a precharge operation when the sense amplifier timing signal (ØSA) is low, transistors 98, 100, 102, 104, and 106 of precharge circuit 92 all turn on to precharge nodes $N_A$ and $N_B$ to approximately $V_{CC}-V_{TP}$. This is because PMOS transistor 104 is in "diode connection" and operates in the saturation region. A voltage drop of $V_{TP}$ exists across PMOS transistor 104. Precharging nodes $V_A$ and $V_B$ before sensing the incoming DATA signal is desirable because it allows sample circuit 94 to operate in a very high-speed manner to pull nodes $N_A$ and $N_B$ toward $V_{CC}$ and ground. Also it maintains information previously latched into hold circuit 96. The direction of voltage swing at nodes $N_A$ and $N_B$ is dependent on the incoming data's logic polarity.

Sample circuit 94 generally functions to sample the incoming DATA transmission signal. Sample circuit 94 receives the latch data timing signal (ØL$_D$) and the latch reference timing signal (ØL$_R$). As depicted, sample circuit 94 includes transistors 109, 111, 112, 114, 116, 118, 120, 122, and 124; inverter gates 126 and 128; and capacitors 130 and 132. Transistors 109 and 111 function as a passgate to a node $N_D$ for sampling voltage values representing data elements in the DATA signal. The passgate is timed with the latch data timing signal (ØL$_D$), as inverted by inverter gate 126. When latch data timing signal (ØL$_D$) is low, the sampled voltage value for a data element is passed to node $N_D$. This voltage can be latched into capacitor 130. Similarly, transistors 112 and 114 function as a passgate to a node $N_R$ for sampling voltage values representing reference elements in the DATA signal. This passgate is timed with the latch reference timing signal (ØL$_R$), as inverted by inverter gate 128. When latch reference timing signal (ØL$_R$) is low, the sampled voltage value for a reference element is passed to node $N_R$. This voltage can be latched into capacitor 132. Transistors 116, 118, 120, 122, and 124 form a high gain differential amplifier, which can amplify the voltage differential between nodes $N_D$ and $N_R$.

Hold circuit 96 generally functions to hold (at a node $D_L$) the sampled voltage as a data element of logic-0 or logic-1. Hold circuit 96 comprises a pair of cross-coupled NAND gates 134 and 136. One input of NAND gate 134 is connected to node $N_A$; one input of NAND gate 136 is connected to node $N_B$.

In operation of sample and hold circuit 60, in a "reference phase," the latch reference timing signal (ØL$_R$) causes the passgate formed from transistors 112 and 114 to pass the incoming DATA signal (appearing on the I/O data bus) to node $N_R$. At the falling edge of ØL$_R$, the voltage of the DATA signal is latched as the reference element voltage at node $N_R$ by capacitor 132. Afterwards, in a "data phase," the latch data timing signal (ØL$_D$) causes the passgate formed from transistors 109 and 111 to pass the incoming DATA signal to node $N_D$. At the falling edge of ØL$_D$, the voltage of the DATA signal is latched as the data element voltage at node $N_D$ by capacitor 130.

When voltage levels representing a data element and a respective reference element are updated at nodes $N_D$ and $N_R$, respectively, the sense amplifier timing signal (ØSA) goes high to turn on the high gain differential amplifier (formed by transistors 116, 118, 120, 122, and 124). This amplifies the differential voltage built up between nodes $N_D$ and $N_R$. Precharge circuit 92 turns off, and the differential amplifier starts to pull the voltages at nodes $N_A$ and $N_B$ toward $V_{CC}$ and ground, respectively, from precharge condition $V_{CC}-V_{TP}$.

According to the convention described above for a two-level scheme, a logic-1 for a reference element and a logic-0 for respective data element in an encoded signal defines a data element with value of logic-0 (i.e., a data-0). A logic-0 for a reference element and a logic-1 for respective data element in an encoded signal defines a data element of logic-1 (i.e., a data-1).

Thus, if incoming DATA is data-0, then the voltage at node $N_R$ will be higher than that of node $N_D$. Consequently, the voltage at node $N_B$ will be pulled low by transistor 118 to build up an amplified differential voltage between nodes $N_A$ and $N_B$. After the amplified differential voltage between nodes $N_A$ and $N_B$ is built up, the voltage at node $N_A$ will be pulled high toward $V_{CC}$ by transistor 122, and the voltage at node $N_B$ will be pulled low toward ground by transistors 118 and 120. At this moment, the further amplified signals at nodes $N_A$ and $N_B$ will be "latched" by the transistors 122, 124, 116, 118, and 120, and the sampled voltage will be held as data-0 at node $D_L$ by hold circuit 96.

If the incoming DATA is data-1, then the voltage at node $N_R$ will be lower than that of node $N_D$. The voltage at node $N_A$ will be pulled low by transistor 116 to build up an amplified differential voltage between nodes $N_A$ and $N_B$. After the amplified differential voltage between nodes $N_A$ and $N_B$ is built up, the voltage at node $N_B$ will be pulled high toward $V_{CC}$ by transistor 124, and the voltage at node $N_A$ will be pulled low toward ground by transistors 116 and 120. At this moment, the further amplified signals at nodes $N_A$ and $N_B$ will be "latched" by transistors 122, 124, 116, 118, and 120, and the sampled voltage will be held as data-1 at node $D_L$ by hold circuit 96.

In one embodiment, two separate sample and hold circuits 60 can be provided in a CDS I/O interface circuit 34. One sample and hold circuit 60 may be used to operate on one part of the incoming DATA transmission signal, while the other may operate on another part of the incoming DATA transmission signal. For example, the data D represented within the DATA signal may be divided equally based upon positioning in a sequence. Data D at odd-numbered positions in the sequence (i.e., first, third, fifth, etc. positions) are operated on by the first sample and hold circuit 60. The latched voltages appearing at node $D_L$ of this sample and hold circuit 60 represent data which can be referred to as "Dod". Data D at even-numbered positions in the sequence (i.e., second, fourth, sixth, etc. positions) are recovered by the second sample and hold circuit 60. The latched voltages appearing at node $D_L$ of this other sample and hold circuit 60 represent data which can be referred to as "Dev".

Exemplary timing diagrams for this embodiment of a sample and hold circuit 60 operating for the data at odd-numbered positions (Dod) and the data at even-numbered positions (Dev) are illustrated and described with reference to FIGS. 12 and 13, respectively.

The recovered data at node $D_L$ in sample and hold circuit 60 is in single data rate (SDR) format. Data-re-formatter circuit 62 is only needed when the recovered data is to be presented in double data rate (DDR) format.

Figure 9:
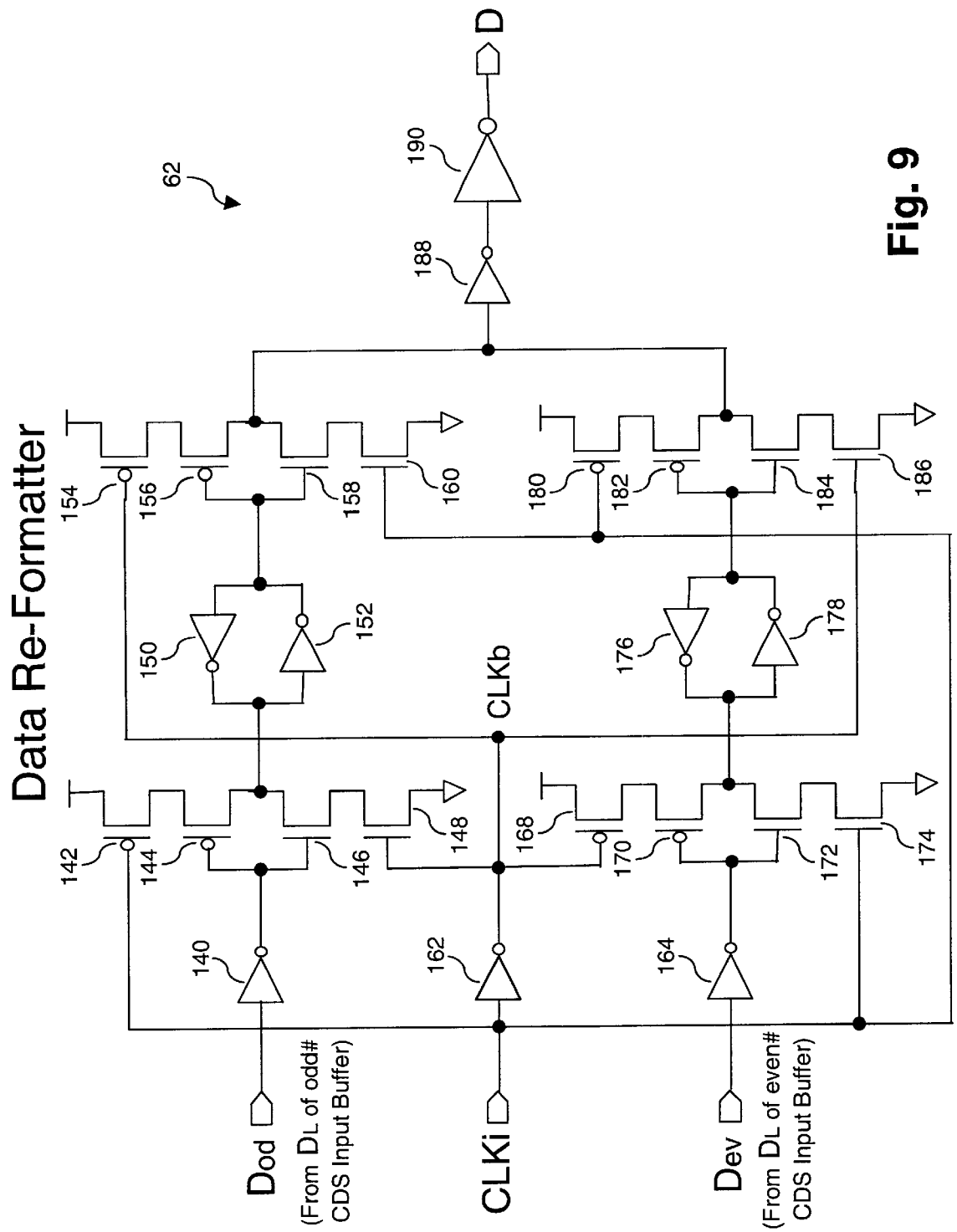
FIG. 9 is a schematic diagram of a data re-formatter circuit for a two-level or three-level scheme, in accordance with an embodiment of the present invention.

FIG. 9 is a schematic diagram of a data re-formatter circuit 62 for a two-level or a three-level scheme, in accordance with an embodiment of the present invention. This embodiment for data re-formatter circuit 62 can be coupled to two sample and hold circuits 60, one of which operates on data D at odd-numbered positions to latch data Dod, and the other of which operates on data D at even-numbered positions to latch data Dev. Data re-formatter circuit 62 converts the data Dod and Dev back to double-data rate format.

As depicted, data re-formatter circuit 62 includes separate circuitry for operating on data Dod and data Dev. In particular, for data Dod, data re-formatter circuit 62 includes an inverter gate 140, which receives and inverts the data Dod signal. A first plurality of transistors 142, 144, 146, and 148 are connected in series between the voltage source and ground. The gates of transistors 144 and 146 receive the output signal of inverter gate 140. The gate of transistor 142 receives the CLKi signal, while the gate of transistor 148 receives a CLKb signal, which is an inverted CLKi signal output by an inverter gate 162. A pair of inverter gates 150 and 152, which implement a cross-coupled latch, are coupled to the first plurality of transistors 142–148. A second plurality of transistors 154, 156, 158, and 160, connected in series between the voltage source and ground, are coupled to the latch formed by inverter gates 150 and 152. The gates of transistors 156 and 158 receive the output signal of the latch, while the gate of transistor 154 receives the CLKb signal and the gate of transistor 160 receives the CLKi signal.

Similarly, for data Dev, data re-formatter circuit 62 includes an inverter gate 164, which receives and inverts the data Dev signal. A first plurality of transistors 168, 170, 172, and 174 are connected in series between the voltage source and ground. The gates of transistors 170 and 172 receive the output signal of inverter gate 164. The gate of transistor 174 receives the CLKi signal, while the gate of transistor 168 receives the CLKb signal. A pair of inverter gates 176 and 178, which are coupled to the first plurality of transistors 168–174, implement a cross-coupled latch. A second plurality of transistors 180, 182, 184, and 186, connected in series between the voltage source and ground, are coupled to the latch formed by inverter gates 176 and 178. The gates of transistors 182 and 184 receive the output signal of the latch, while the gate of transistor 180 receives the CLKi signal and the gate of transistor 186 receives the CLKb signal.

The pluralities of transistors 142–148 (for data Dod) and transistors 168–174 (for data Dev) form a first 2-to-1 multiplexer. When the CLKi signal is low, the first multiplexer transfers the data Dod to the cross-coupled latch formed by inverter gates 150 and 152. When the CLKi signal is high, the first multiplexer transfers the data Dev to the cross-coupled latch formed by inverter gates 176 and 178. The pluralities of transistors 154–160 (for data Dod) and 180–186 (for data Dev) form a second 2-to-1 multiplexer. When the CLKi signal is high, the second multiplexer transfers the data in the latch of inverter gates 150 and 152 to output node D, via inverter gates 188 and 190. When the CLKi signal is low, the second multiplexer transfers the data in latch of inverter gates 176 and 178 to output node D.

An exemplary timing diagram for this embodiment of a data re-formatter circuit 62 operating at double data rate (DDR) is illustrated and described with reference to FIG. 14.

Timing Diagram For CDS Output Buffer (Two-Level, DDR)

Figure 10:
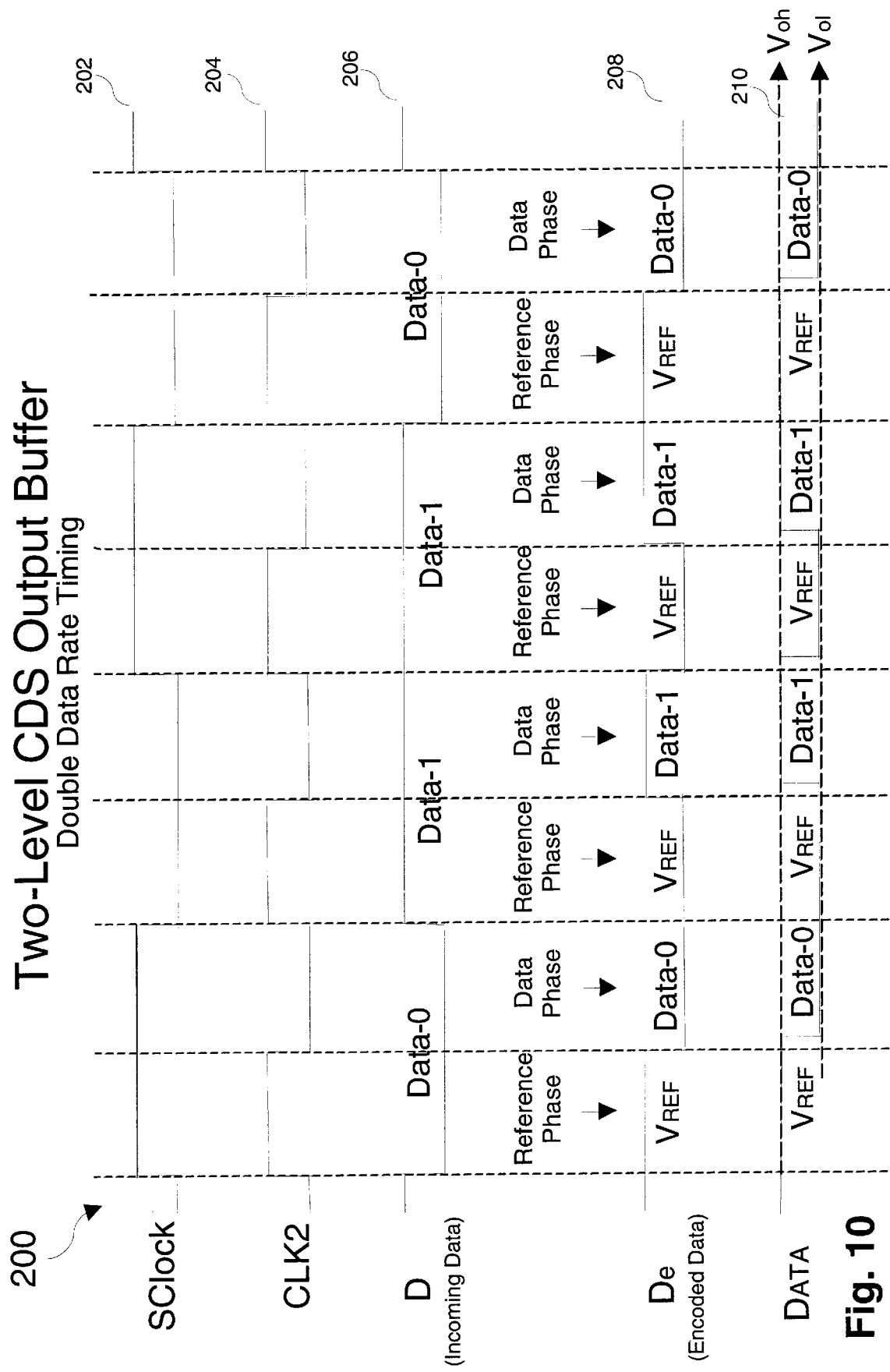
FIG. 10 is an exemplary timing diagram for a CDS output buffer circuit for a two-level scheme and operating at double data rate, in accordance with an embodiment of the present invention.

FIG. 10 is an exemplary timing diagram 200 for a CDS output buffer circuit 44, in accordance with an embodiment of the present invention. Timing diagram 200 illustrates how a stream or sequence of data D is formatted when a CDS output buffer circuit 44 using a two-level scheme (FIG. 7) outputs a DATA transmission signal to the I/O data bus at the double data rate (DDR) format according to the cycle of the decoding clock (CLK2) signal. For the DDR format, the frequency of the decoding clock (CLK2) signal is twice that of the synchronous (SClock).

Timing diagram 200 includes exemplary waveforms for various signals in CDS output buffer circuit 44. These waveforms include waveform 202 for the synchronous clock (SClock) signal, waveform 204 for the decoding clock (CLK2) signal, waveform 206 for the incoming data D, waveform 208 for the encoded data (De), and waveform 210 for the outgoing DATA transmission signal.

The data D represented by waveform 206 comprises a number of data elements, each of which can be either data-0 or data-1. Data encoder circuit 54 of CDS output buffer circuit 44 encodes or formats each data element by adding a separate reference element ($V_{REF}$) Waveform 208 represents the encoded data elements. As depicted, each reference element has a logic value opposite to that of the respective data element- That is, for data-0, $V_{REF}$ has a value of logic-1, and for data-1, $V_{REF}$ has a value of logic-0. Each encoded data element is output in a reference phase (for the reference element) and a data phase (for the data element). Both the reference phase and the data phase are equal to half of a cycle for the decoding clock (CLK2) signal represented by waveform 204. Slew rate control circuit 56 operates to control the transition time of the DATA signal conveying the encoded data elements and driven by output driver circuit 58. Waveform 210 illustrates the time delay caused by slew rate control circuit 56 and output driver circuit 58 to waveform 208.

Timing Diagram For CDS Output Buffer (Two-Level, SDR)

Figure 11:
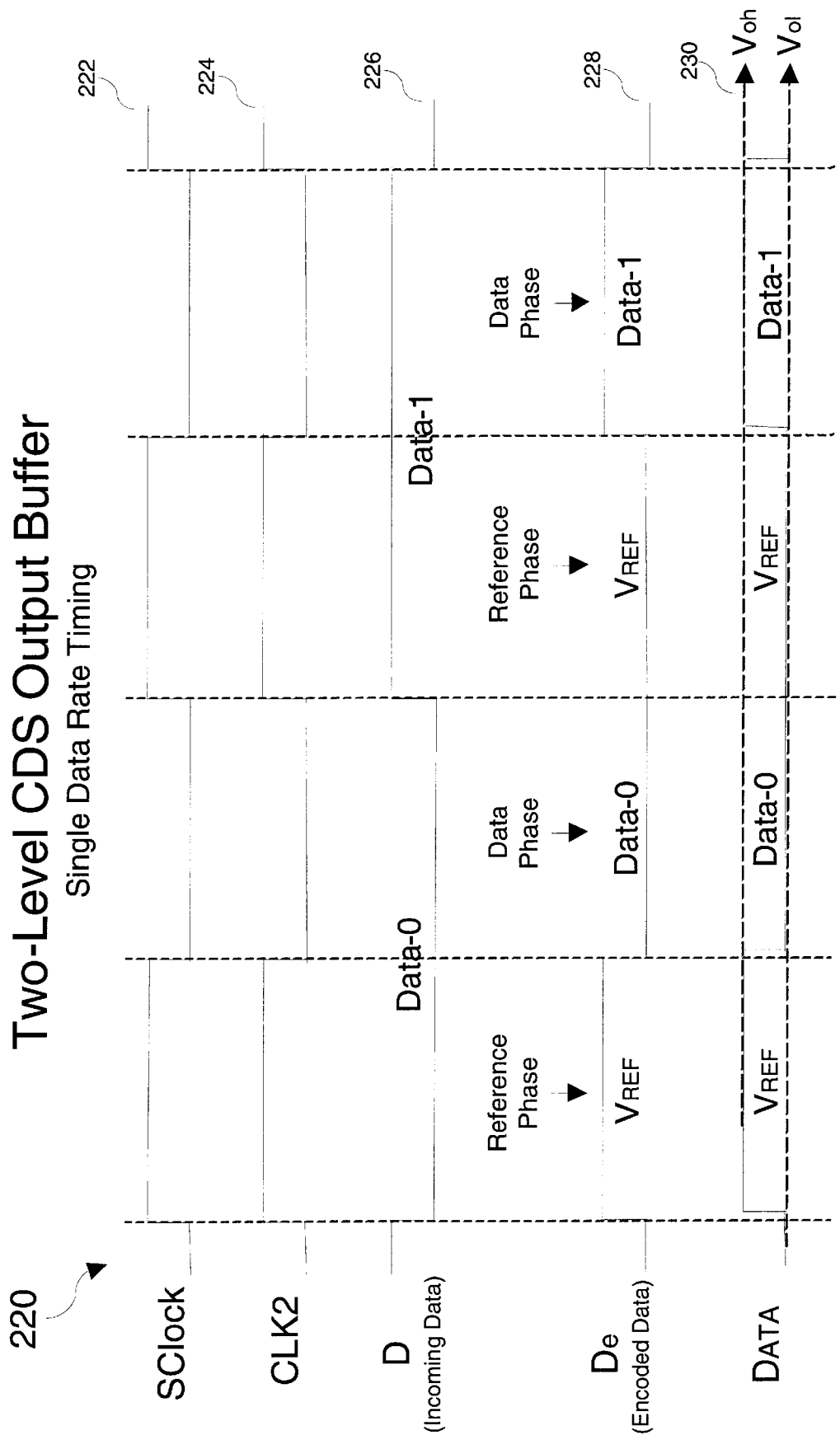
FIG. 11 is an exemplary timing diagram for a CDS output buffer circuit for a two-level scheme and operating at single data rate, in accordance with an embodiment of the present invention.

FIG. 11 is an exemplary timing diagram 220 for a CDS output buffer circuit 44, in accordance with an embodiment of the present invention. Timing diagram 220 illustrates how a stream or sequence of data D is formatted when a CDS output buffer circuit 44 using a two-level scheme (FIG. 7) outputs a DATA transmission signal to the I/O data bus at the single data rate (SDR) format according to the cycle of the decoding clock (CLK2) signal. For the SDR format, the frequency of the decoding clock (CLK2) signal is the same as that of the synchronous (SClock).

Timing diagram 220 includes exemplary waveforms for various signals in CDS output buffer circuit 44. These waveforms include waveform 222 for the synchronous clock (SClock) signal, waveform 224 for the decoding clock (CLK2) signal, waveform 226 for the incoming data D, waveform 228 for the encoded data (De), and waveform 230 for the outgoing DATA transmission signal.

Waveform 226 represents a sequence of data D comprising a number of data elements, each of which can be either data-0 or data-1. This waveform 226 can be operated on by data encoder circuit 54 of CDS output buffer circuit 44 which encodes or formats each data element by adding a separate reference element ($V_{REF}$). Waveform 228 represents the encoded data elements. As shown, each reference element has a logic value opposite to that of the respective data element. Each encoded data element is output in a reference phase (for the reference element) and a data phase (for the data element). Both the reference phase and the data phase are equal to half of a cycle for the decoding clock (CLK2) signal represented by waveform 224. Slew rate control circuit 56 operates to control the transition time of the DATA signal which conveys the encoded data elements.

Waveform 230 illustrates the time delay caused by slew rate control circuit 56 and output driver circuit 58.

Timing Diagram For Sample and Hold Circuit (DDR, Data-Odd Component)

Figure 12:
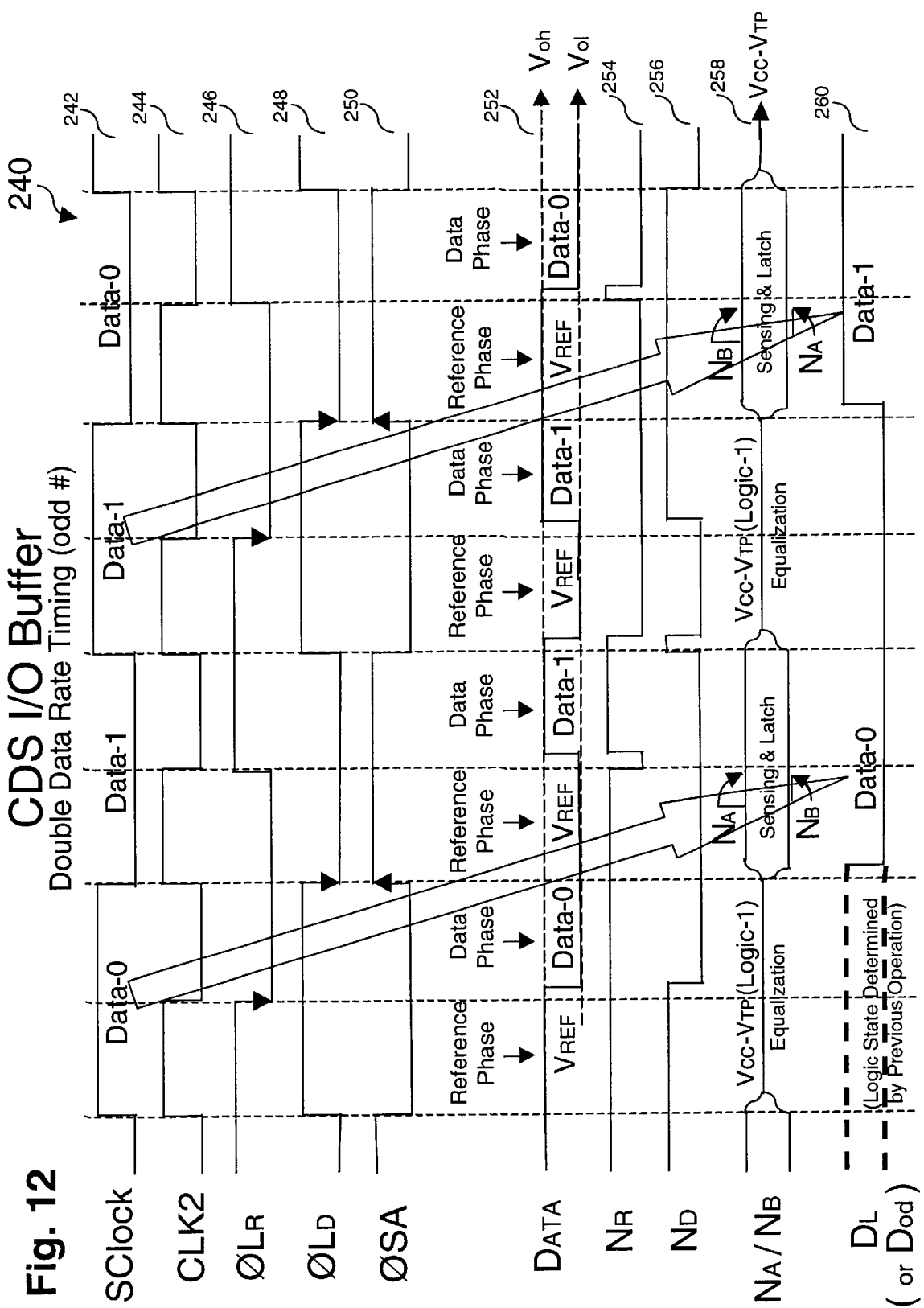
FIG. 12 is an exemplary timing diagram for a sample and hold circuit operating at double data rate and on data at odd-numbered positions, in accordance with an embodiment of the present invention.

FIG. 12 is an exemplary timing diagram 240 for a sample and hold circuit 60 of a CDS input buffer circuit 46 operating on data at odd-numbered positions in a DATA signal, in accordance with an embodiment of the present invention. Timing diagram 240 illustrates how a sample and hold circuit 60 using a two-level or a three-level scheme (FIG. 8) receives the DATA transmission signal, samples for voltages representing data at odd-numbered positions, and holds the data for re-formatting at double data rate (DDR) format. For the DDR format, the frequency of the decoding clock (CLK2) signal is twice that of the synchronous (SClock).

Timing diagram 240 includes exemplary waveforms for various signals in sample and hold circuit 60. These waveforms include waveform 242 for the synchronous clock (SClock) signal, waveform 244 for the decoding clock (CLK2) signal, waveform 246 for the latch reference timing signal ($ØL_R$), waveform 248 for the latch data timing signal ($ØL_D$), waveform 250 for the sense amplifier timing signal (ØSA), waveform 252 for the incoming DATA transmission signal, waveform 254 for the voltage at node $N_R$, waveform 256 for the voltage at node $N_D$, waveform 258 for the voltage at nodes $N_A/N_B$, and waveform 260 for the voltage appearing at node $D_L$ for the Dod component.

Waveforms 242–260 are provided to facilitate the understanding of the interaction between a CDS output buffer circuit 44 and a sample and hold circuit 60 by illustrating the timing relationships among the synchronous clock (SClock) signal, the decoding clock (CLK2) signal, the latch reference timing signal ($ØL_R$), the latch data timing signal ($ØL_D$), the sense amplifier timing signal (ØSA), the DATA signal, and the voltages at node $N_R$, $N_D$, $N_A$, $N_B$ and $D_L$ (for Dod).

DATA transmission signal represented by waveform 252 can be placed onto an I/O bus by a CDS output buffer circuit 44 (FIG. 7). The DATA transmission signal includes voltage values representing data elements and respective reference elements. The voltage value for a reference element appears in a reference phase, the voltage value for a data element appears in a data phase. Each reference element has a logic polarity opposite to respective data element. Both the reference phase and the data phase are equal to one-half cycle of the decoding clock (CLK2). Only two signal levels are available to represent any given reference element or data element. These signal levels are high voltage level (Voh) and low voltage level (Vol).

The phase of the latched data $D_L$ (for Dod), as represented by waveform 260, is delayed by one cycle of the decoding (CLK2) or a half cycle of the synchronous (SClock) relative to the DATA transmission signal, as represented by waveform 252.

Timing Diagram For Sample and Hold Circuit (DDR, Data-Even Component)

Figure 13:
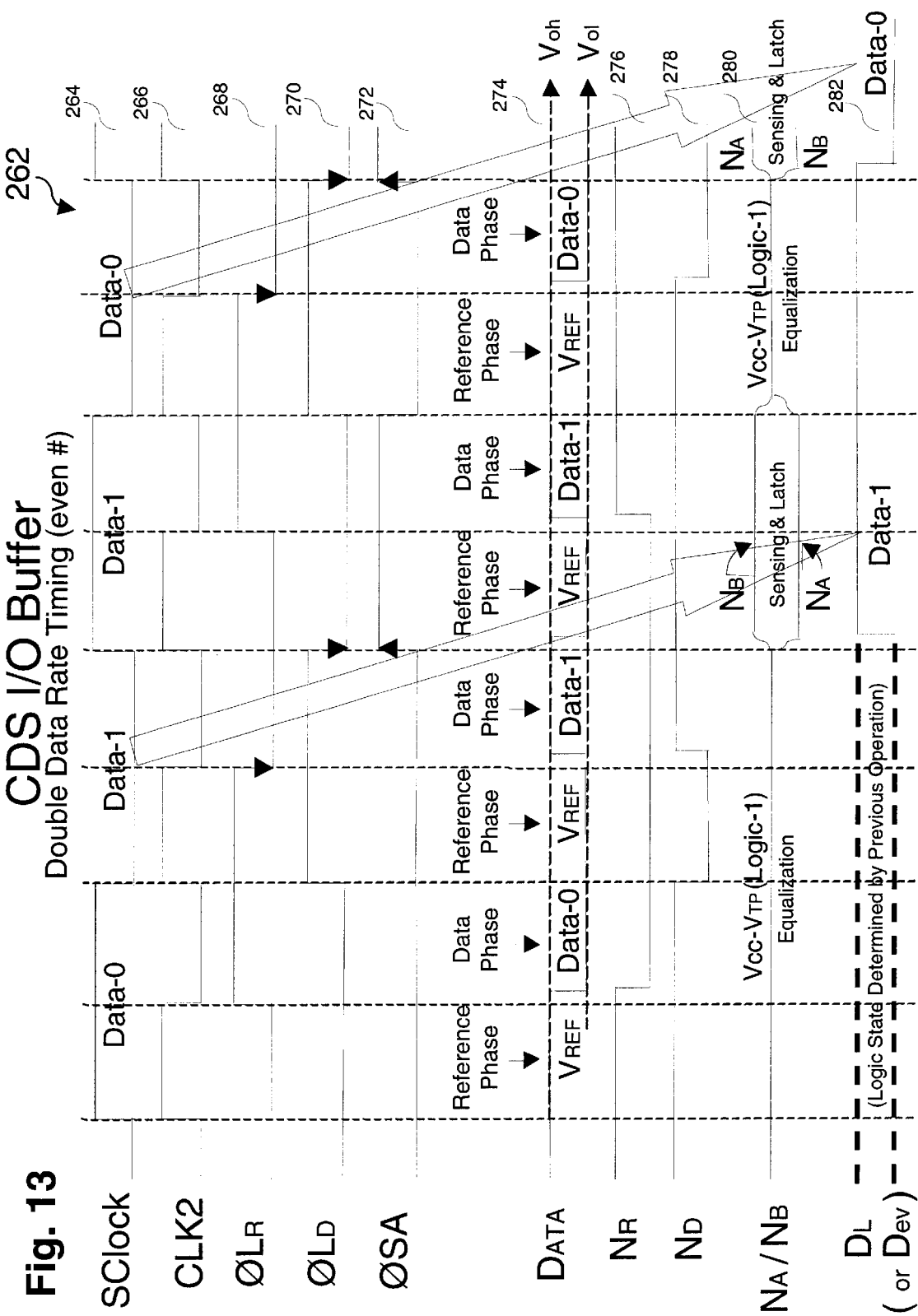
FIG. 13 is an exemplary timing diagram for a sample and hold circuit, operating at double data rate and on data at even-numbered positions, in accordance with an embodiment of the present invention.

FIG. 13 is an exemplary timing diagram 262 for a sample and hold circuit 60 of a CDS input buffer circuit 46 operating on data at even-numbered positions in a DATA signal, in accordance with an embodiment of the present invention. Timing diagram 262 illustrates how a sample and hold circuit 60 using a two-level or a three-level scheme (FIG. 8) receives the DATA transmission signal, samples for voltages representing data at even-numbered positions, and holds the data for re-formatting at double data rate (DDR) format.

Timing diagram 262 includes exemplary waveforms for various signals in sample and hold circuit 60. These waveforms include waveform 264 for the synchronous clock (SClock) signal, waveform 266 for the decoding clock (CLK2) signal, waveform 268 for the latch reference timing signal ($ØL_R$), waveform 270 for the latch data timing signal ($ØL_D$), waveform 272 for the sense amplifier timing signal (ØSA), waveform 274 for the incoming DATA transmission signal, waveform 276 for the voltage at node $N_R$, waveform 278 for the voltage at node $N_D$, waveform 280 for the voltage at nodes $N_A/N_B$, and waveform 282 for the voltage appearing at node $D_L$ for the Dev component.

Waveforms 264–282 are provided to facilitate the understanding of the interaction between a CDS output buffer circuit 44 and a sample and hold circuit 60 by illustrating the timing relationships among synchronous clock (SClock) signal, the decoding clock (CLK2) signal, the latch reference timing signal ($ØL_R$), the latch data timing signal ($ØL_D$), the sense amplifier timing signal (ØSA), the DATA transmission signal, and the voltages at node $N_R$, $N_D$, $N_A$, $N_B$ and $D_L$ (for Dev). Such relationships are similar to those described with reference to FIG. 12 for the data-odd (Dod) component.

Timing Diagram For Data Re-formatter Circuit (DDR)

Figure 14:
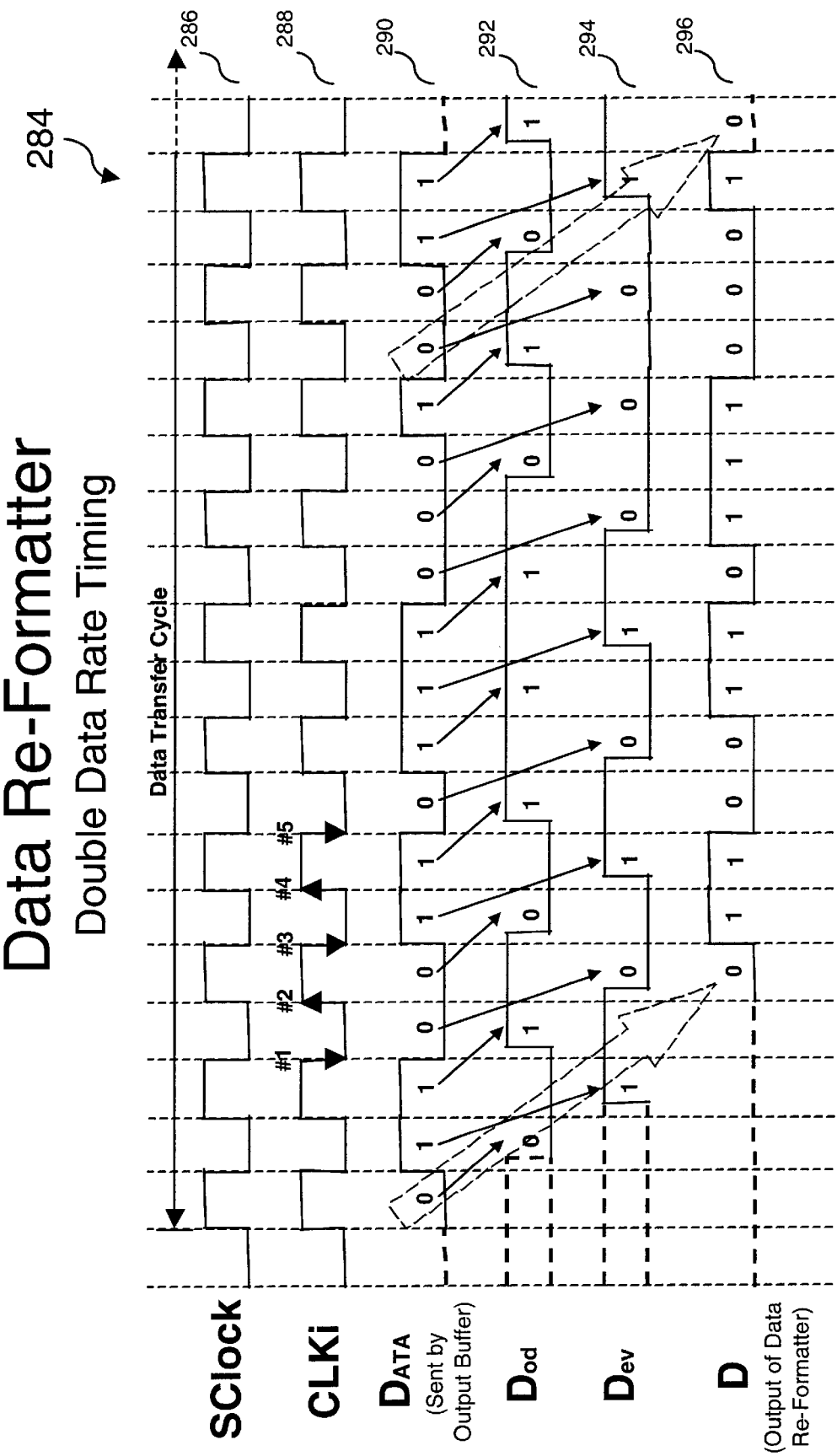
FIG. 14 is an exemplary timing diagram for a data re-formatter circuit operating at double data rate, in accordance with an embodiment of the present invention.

FIG. 14 is an exemplary timing diagram 284 for a data re-formatter circuit 62 of a CDS input buffer circuit 46, in accordance with an embodiment of the present invention. Timing diagram 284 illustrates how data re-formatter circuit 62 using a two-level or a three-level scheme (FIG. 9) receives the data-even (Dev) and data-odd (Dod) components from two sample and hold circuits 60, and operates on these components to re-construct data D at double data rate (DDR) format.

Timing diagram 284 includes exemplary waveforms for various signals in data re-formatter circuit 62. These waveforms include waveform 286 for the synchronous clock (SClock) signal, waveform 288 for the CLKi clock signal, waveform 290 for the DATA transmission signal, waveform 292 for the Dod component, waveform 294 for the Dev component, and waveform 296 for the recovered data D.

Each of the Dod and Dev components, as represented by waveforms 292 and 294, include a number of data elements. CLKi signal, as represented by waveform 286, includes a number of pulses. In one embodiment, as illustrated, elements for the Dod component are sent out during the high time of the CLKi signal, and elements for the Dev component are sent out during the low time of the CLKi signal.

For example, at the falling edge of one pulse (indicated by "#1"), the first element of the Dod component is latched into cross-coupled inverters 150 and 152. At the rising edge of the next pulse of CLKi (indicated by "#2"), this first element of the Dod component is transferred out as data D via inverter gates 188 and 190. Also at the rising edge of the next pulse of CLKi (indicated by "#2"), the first element of the Dev component is latched into cross-coupled inverters 176 and 178. At the falling edge of the next pulse of CLKi (indicated by "#3"), this first element of the Dev component is transferred out as data D via inverter gates 188 and 190. At this same falling edge (indicated by "#3"), the second element of the Dod component is latched into cross-coupled inverters 150 and 152. At the rising edge of the next pulse of CLKi (indicated by "#4"), this second element of the Dod component is transferred out as data D. At the same rising edge of CLKi (indicated by "#4"), the second element of the Dev component is latched into cross-coupled inverters 176 and 178. The second element of the Dev component is then transferred out as data D at the falling edge of the next pulse of CLKi (indicated by "#5"). This operation continues until the data re-formatting is completed.

CDS Output Buffer Circuit (Three-Level)

Figure 15:
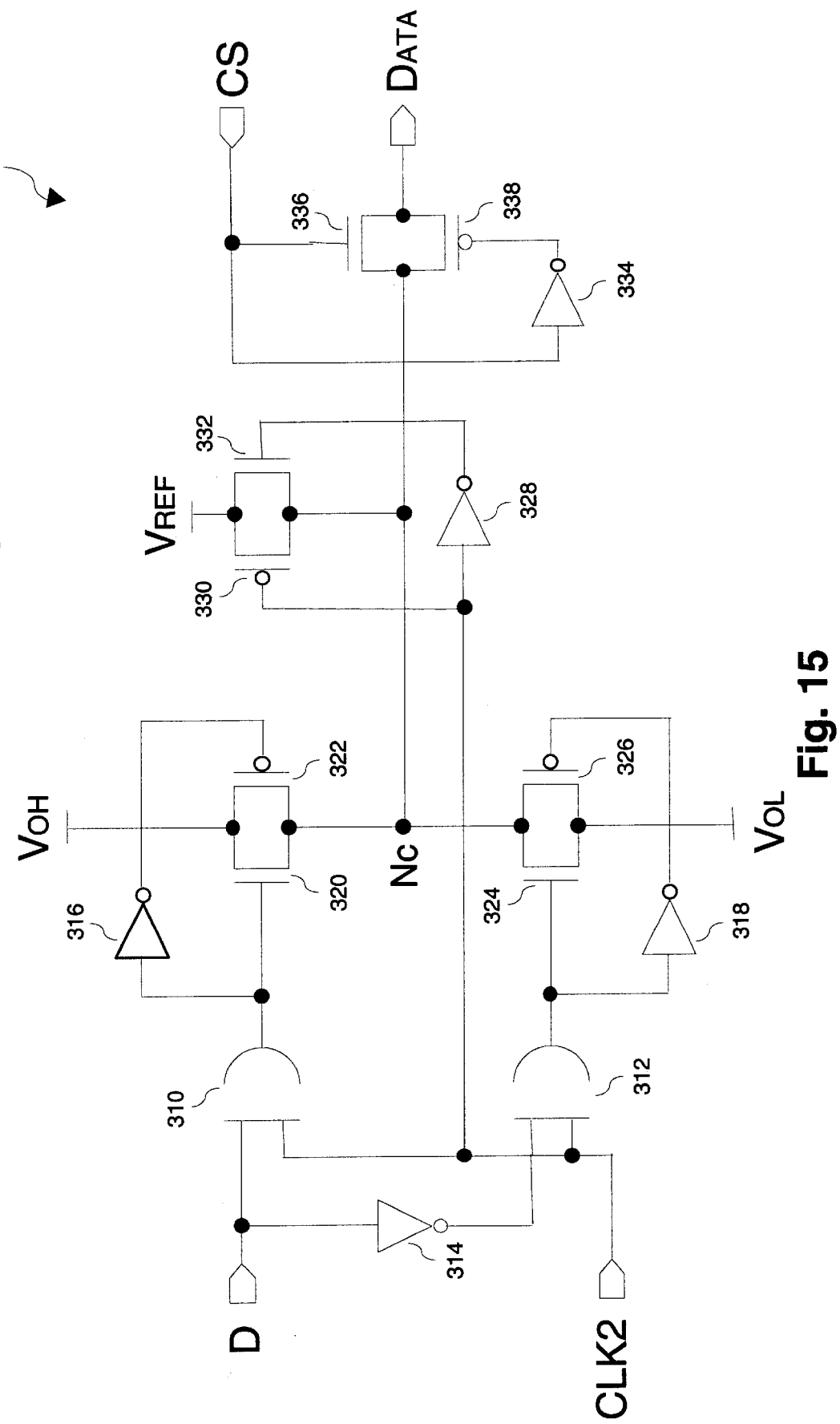
FIG. 15 is a schematic diagram of CDS output buffer circuit for a three-level scheme and operating at double data rate, in accordance with an embodiment of the present invention.

FIG. 15 is a schematic diagram of CDS output buffer circuit 44 for a three-level scheme, in accordance with an embodiment of the present invention. CDS output buffer circuit 44 may be part of a CDS I/O interface circuit 34, which can be incorporated into a semiconductor device or chip. CDS output buffer circuit 44 operates on a stream of data D to be output from the semiconductor device. In particular, CDS output buffer circuit 44 generates a DATA transmission signal for transferring data D out of the semiconductor chip.

In the three level scheme of this embodiment, three signal levels are possible for the outgoing DATA transmission signal. Two signal levels are available for representing any data element and a third signal level is provided for representing each reference element. The signal levels for a data element are a high voltage level ($V_{OH}$) and a low voltage level ($V_{OL}$), and the signal level for the reference element is a reference voltage level ($V_{REF}$). The voltage level of $V_{REF}$ preferably is between that of $V_{OH}$ and $V_{OL}$. For the signal levels, output buffer circuit 44 uses three power supply sources: a voltage source $V_{OH}$, a voltage source $V_{OL}$, and a voltage source $V_{REF}$.

In this embodiment, output buffer circuit 44 comprises AND gates 310 and 312. AND gate 310 receives the data D signal at one input node and the decoding clock (CLK2) signal at another input node. AND gate 312 receives the decoding clock (CLK2) signal at one input node the inverse of data D signal (output by an inverter gate 314) at another input node. An inverter gate 316 inverts the output of AND gate 310, and an inverter gate 318 inverts the output of AND gate 312.

A pair of transistors 320, 322 are connected in parallel between voltage source $V_{OH}$ and a node $N_C$. The gate of transistor 320 receives the output signal of AND gate 310, and the gate of transistor 322 receives the output signal of inverter gate 316. These transistors 320, 322 form a passgate for voltage source $V_{OH}$. Similarly, a pair of transistors 324, 326 are connected in parallel between voltage source $V_{OL}$ and node $N_C$. The gate of transistor 324 receives the output signal of AND gate 312, and the gate of transistor 326 receives the output signal of inverter gate 318. Transistors 324, 326 form a passgate for voltage source $V_{OL}$.

An inverter gate 328 inverts the decoding clock (CLK2) signal. A pair of transistors 330, 332 are connected in parallel between voltage source $V_{REF}$ and node $N_C$. The gate of transistor 330 receives the CLK2 signal, and the gate of transistor 332 receives the inverted CLK2 signal output by inverter gate 328. Transistors 330, 332 form a passgate for voltage source $V_{REF}$.

An inverter gate 334 inverts a chip select (CS) signal. A pair of transistors 336, 338 are connected in parallel between node $N_C$ and an output node at which the DATA signal appears. The gate of transistor 336 receives the CS signal, and the gate of transistor 338 receives the inverted CS signal output by inverter gate 334. Transistors 336, 338 form a passgate for the voltage at node $N_C$.

AND gates 310, 312 and inverter gates 314, 316, 318, 328 implement a data encoder to encode the incoming data D. This data encoder functions as a 3-to-1 multiplexer to select one of the three power supply voltages ($V_{OH}$, $V_{OL}$, and $V_{REF}$) for placement on the I/O data bus according to the logic value of incoming data D and the phase of the CLK2 signal. Specifically, when the CLK2 signal is low, transistors 330, 332 will be turned on by the data encoder to drive the I/O data bus to $V_{REF}$ level. When the CLK2 signal is high, if the incoming data D has a value of logic-0, then transistors 324, 326 will be turned on by the data encoder to drive the I/O data bus to $V_{OL}$ level. If the incoming data D has a value of logic-1 when the CLK2 signal is high, then transistors 320, 322 will be turned on by the data encoder to drive the I/O data bus to $V_{OH}$ level. When the CS signal is high, the output drivers of the CDS output buffer 44 are connected to the I/O data bus.

For each element of data D in a stream, this embodiment of CDS output buffer circuit 44 outputs either $V_{OL}$ or $V_{OH}$ level on the outgoing DATA transmission signal. $V_{REF}$ level is output for each reference element in a reference phase. Each reference element thus has a voltage value which coincides with the voltage level of reference voltage source $V_{REF}$ at the time that the reference element is created. The signal levels for data elements are output in a data phase, and the signal levels for reference elements are output in a reference phase. With this embodiment, the voltage representing a particular reference element comes before the voltage representing the respective data element in the DATA transmission signal—i.e., the reference phase precedes the data phase. For the double data rate (DDR) format, both the reference phase and the data phase are equal to one-half of a cycle of the decoding clock (CLK2).

In one embodiment, an external pull-up resistor $R_T$ is provided on each I/O data bus. $R_T$ is connected to a termination voltage $V_{TT}$. The voltage of $V_{TT}$ is equal to that of $V_{REF}$. The preferred termination voltage $V_{TT}$ for this embodiment is one half of ($V_{OH}$+$V_{OL}$).

An exemplary timing diagram for this embodiment of a CDS output buffer circuit 44 operating at double data rate (DDR) is illustrated and described with reference to FIG. 16.

Timing Diagram For CDS Output Buffer (Three-Level, DDR)

Figure 16:
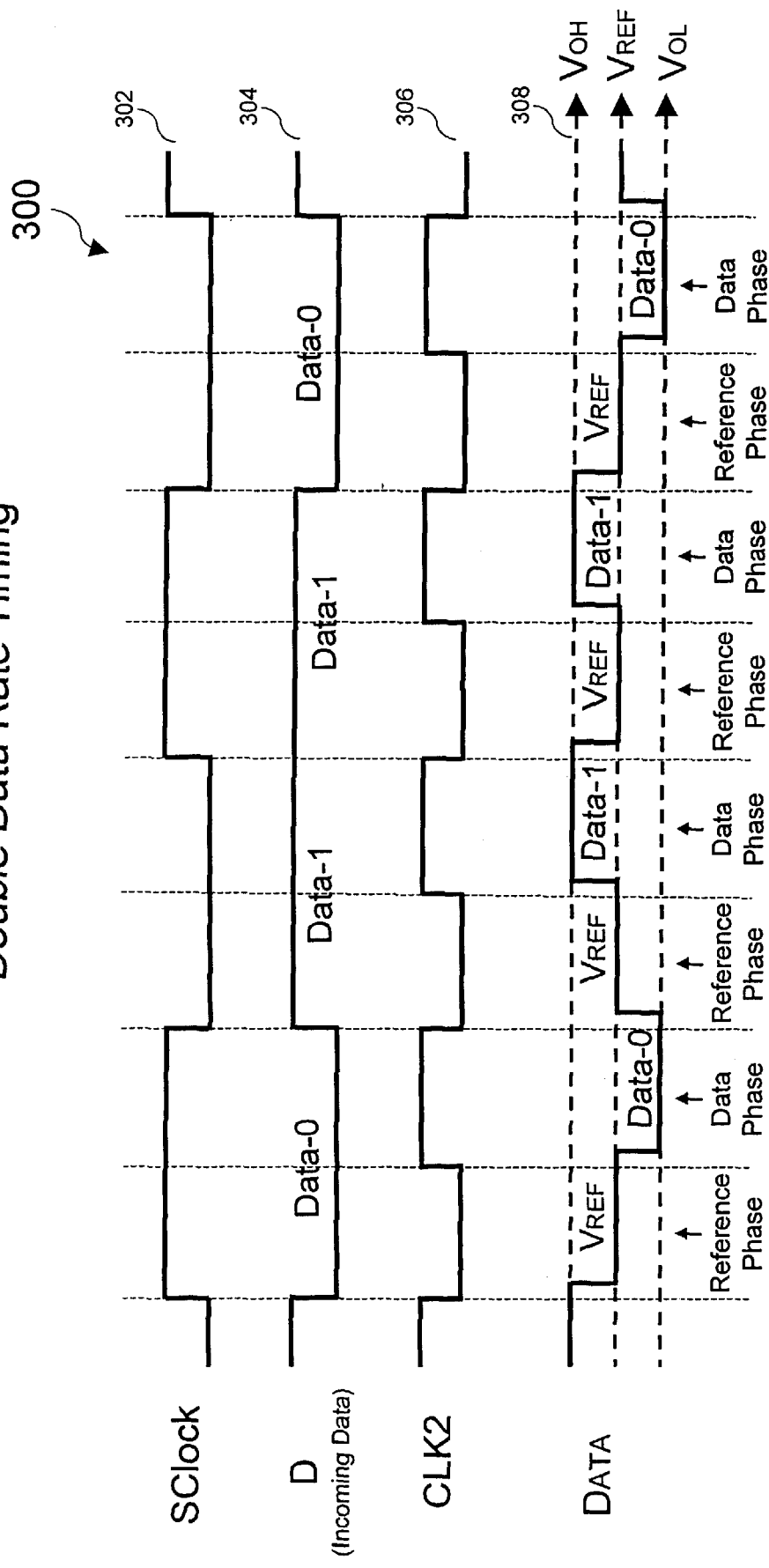
FIG. 16 is an exemplary timing diagram for a CDS output buffer circuit for a three-level scheme and operating at double data rate, in accordance with an embodiment of the present invention.

FIG. 16 is an exemplary timing diagram 300 for a CDS output buffer circuit 44, in accordance with an embodiment of the present invention. Timing diagram 300 illustrates how a stream or sequence of data D is formatted when a CDS output buffer circuit 44 using a three-level scheme (FIG. 12) outputs a DATA transmission signal to the I/O data bus at the double data rate (DDR) format according to the cycle of the decoding clock (CLK2) signal. For the DDR format, the frequency of the decoding clock (CLK2) signal is twice that of the synchronous (SClock).

Timing diagram 300 includes exemplary waveforms for various signals in CDS output buffer circuit 44. These waveforms include waveform 302 for the synchronous clock (SClock) signal, waveform 304 for the incoming data D, waveform 306 for the decoding clock (CLK2) signal, and waveform 308 for the outgoing DATA transmission signal.

The data D represented by waveform 304 comprises a number of data elements, each of which can be either data-0 or data-1. Data encoder (implemented by AND gates 310, 312 and inverter gates 314, 316, 318, and 328) encodes or formats each data element by adding a separate reference element ($V_{REF}$). The encoded signal is then sent out to the I/O bus. Waveform 308 is the DATA transmission signal resulting from data D waveform 304 after encoding. The timing delay of waveform 308 is caused by the passgates formed by transistors 320, 322, 324, 326, 330, 332, 336, and 338. In waveform 308, each reference element precedes the respective data element. The reference element is output in a reference phase and the data element is output in a data phase. Both the reference phase and the data phase are equal to half of a cycle for the decoding clock (CLK2) signal represented by waveform 306. The signal level of the DATA signal for each reference element is $V_{REF}$. Furthermore, for data-0, the signal level of the DATA signal is $V_{OL}$, and for data-1, the signal level of the DATA signal is $V_{OH}$.

Although the present invention and its advantages have been described in detail, it should be understood that various changes, substitutions, and alterations can be made therein without departing from the spirit and scope of the invention as defined by the appended claims.

What is claimed is:

1. An input/output interface circuit for a semiconductor chip, the input/output interface circuit comprising:

an output buffer circuit operable to receive a first stream of data elements for output from the semiconductor chip, add a separate reference element for each data element in the first stream, and generate a first data transmission signal representing the data elements of the first stream and the respective reference elements; and an input buffer circuit operable to receive a second data transmission signal representing data elements of a second stream and respective reference elements for the data elements of the second stream, sample the second data transmission signal to obtain voltage values for each data element of the second stream and the respective reference element, and interpret the voltage value for each data element of the second stream against the voltage value for the respective reference element in order to recover the data elements of the second stream.

2. The input/output interface circuit of claim 1 wherein the output buffer circuit is operable to control the skew of the first data transmission signal.

3. The input/output interface circuit of claim 1 wherein the output buffer circuit is operable to drive the first data transmission signal.

4. The input/output interface circuit of claim 1 wherein the output buffer circuit comprises:

a data encoder circuit operable to encode the first stream of data elements;

a slew rate control circuit coupled to the data encoder circuit, the slew rate control circuit operable to control the slew rate of an output driver circuit when transmitting the first data transmission signal; and an output driver circuit coupled to the slew rate control circuit, the output driver circuit operable to drive the first data transmission signal.

5. The input/output interface circuit of claim 1 wherein the input buffer circuit comprises a sample and hold circuit operable to sample voltages values for each data element of the second stream and the respective reference element, the sample and hold circuit operable to compare the sampled voltage for each data element of the second stream against the sampled voltage for the respective reference element.

6. The input/output interface circuit of claim 1 wherein the first and second data transmission signals are formatted according to a two-level scheme wherein two signal levels are available to represent each data element and each reference element.

7. The input/output interface circuit of claim 1 wherein the first and second data transmission signals are formatted according to a three-level scheme wherein a first and second signal levels are available to represent each data element and a third signal level is used to represent each reference element.

8. A method for interfacing between a first semiconductor chip and a second semiconductor chip, the method comprising:

receiving a stream of data elements for output from the first semiconductor chip;

adding a separate reference element for each data element in the stream;

generating a data transmission signal representing the data elements of the stream and the respective reference elements;

transmitting the data transmission signal out of the first semiconductor chip and to the second semiconductor chip.

9. The method of claim 8 further comprising:

receiving the data transmission signal at the second semiconductor chip;

sampling the data transmission signal to obtain voltage values for each data element of the data stream and the respective reference element; and interpreting the voltage value for each data element of the second stream against the voltage value for the respective reference element in order to recover the data elements of the data stream at the second semiconductor chip.

10. The method of claim 9 wherein sampling comprises:

latching a voltage value for each data element at a first node; and latching a voltage value for each respective reference element at a second node.

11. The method of claim 9 wherein interpreting comprises comparing the voltage value for each data element against the voltage value for the respective reference element.

12. The method of claim 8 wherein the data transmission signal is formatted according to a two-level scheme wherein two signal levels are available to represent each data element and each reference element.

13. The method of claim 8 wherein the data transmission signal is formatted according to a three-level scheme wherein a first and second signal levels are available to represent each data element and a third signal level is used to represent each reference element.

14. A method for interfacing with a semiconductor chip comprises:

receiving a data transmission signal representing data elements of a data stream and respective reference elements for the data elements of the data stream;

sampling the data transmission signal to obtain voltage values for each data element of the data stream and the respective reference element; and interpreting the voltage value for each data element of the second stream against the voltage value for the respective reference element in order to recover the data elements of the data stream.

15. The method of claim 14 wherein sampling comprises:

latching a voltage value for each data element at a first node; and latching a voltage value for each respective reference element at a second node.

16. The method of claim 14 wherein interpreting comprises comparing the voltage value for each data element against the voltage value for the respective reference element.

17. The method of claim 14 wherein the data transmission signal is formatted according to a two-level scheme wherein two signal levels are available to represent each data element and each reference element.

18. The method of claim 14 wherein the data transmission signal is formatted according to a three-level scheme wherein a first and second signal levels are available to represent each data element and a third signal level is used to represent each reference element.

19. A semiconductor chip comprising:

a timing circuit operable to generate a plurality of timing signals; and an input/output interface circuit coupled to the timing circuit and receiving at least one timing signal from the timing circuit, the input/output interface circuit operable to receive a first stream of data elements for output from the semiconductor chip, add a separate reference element for each data element in the first stream, and generate a first data transmission signal representing the data elements of the first stream and the respective reference elements.

20. The semiconductor chip of claim 19 wherein the input/output interface circuit is operable to receive a second data transmission signal representing data elements of a second stream and respective reference elements for the data elements of the second stream, sample the second data transmission signal to obtain voltage values for each data element of the second stream and the respective reference element, and interpret the voltage value for each data element of the second stream against the voltage value for the respective reference element in order to recover the data elements of the second stream.

21. The semiconductor chip of claim 19 comprises a separate synchronous clock generator circuit, the synchronous clock generator circuit operable to cooperate to provide a synchronous clock signal.

22. An integrated circuit device comprising:
a plurality of semiconductor chips; and
a central access hub coupled to each of the semiconductor chips, the central access hub operable to receive a first stream of data elements for output from the integrated circuit device, add a separate reference element for each data element in the first stream, and generate a first data transmission signal representing the data elements of the first stream and the respective reference elements.

23. The integrated circuit device of claim 22 wherein the central access hub is operable to receive a second data transmission signal representing data elements of a second stream and respective reference elements for the data elements of the second stream, sample the second data transmission signal to obtain voltage values for each data element of the second stream and the respective reference element, and interpret the voltage value for each data element of the second stream against the voltage value for the respective reference element in order to recover the data elements of the second stream.

24. The integrated circuit device of claim 22 wherein each semiconductor chip comprises a memory chip.

25. The integrated circuit device of claim 22 wherein the central access hub comprises at least one input/output interface circuit implementing a correlated double-sampling technique for transmitting and receiving data transmission signals.

26. The integrated circuit device of claim 22 wherein each of the semiconductor chips and the central access hub comprises a separate synchronous clock generator circuit, the synchronous clock generator circuits operable to cooperate to provide a synchronous clock signal throughout the integrated circuit device.

* * * * *